(12) United States Patent
Axelrod et al.

(10) Patent No.: US 10,395,888 B2
(45) Date of Patent: Aug. 27, 2019

(54) OPTICAL-CAVITY BASED PONDEROMOTIVE PHASE PLATE FOR TRANSMISSION ELECTRON MICROSCOPY

(71) Applicant: THE REGENTS OF THE UNIVERSITY OF CALIFORNIA, Oakland, CA (US)

(72) Inventors: Jeremy J. Axelrod, Berkeley, CA (US); Osip Schwartz, Albany, CA (US); Robert M. Glaeser, Berkeley, CA (US); Holger Mueller, Orinda, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/939,028

(22) Filed: Mar. 28, 2018

(65) Prior Publication Data
US 2018/0286631 A1 Oct. 4, 2018

Related U.S. Application Data

(60) Provisional application No. 62/479,044, filed on Mar. 30, 2017.

(51) Int. Cl.
*H01J 37/26* (2006.01)
*H01J 37/04* (2006.01)
*H01J 37/285* (2006.01)

(52) U.S. Cl.
CPC ............ *H01J 37/266* (2013.01); *H01J 37/04* (2013.01); *H01J 37/285* (2013.01); *H01J 2237/2482* (2013.01); *H01J 2237/2614* (2013.01)

(58) Field of Classification Search
CPC ........ H01J 37/266; H01J 37/285; H01J 37/04; H01J 2237/2482; H01J 2237/2614
USPC .......................... 250/306, 307, 309, 310, 311
See application file for complete search history.

(56) References Cited

U.S. PATENT DOCUMENTS

| 6,667,830 | B1 * | 12/2003 | Iketaki | ................. | G01N 21/636 |
| | | | | | 250/458.1 |
| 8,217,352 | B2 | 7/2012 | Reed | | |
| 2007/0014392 | A1 * | 1/2007 | Madey | ..................... | H05G 2/00 |
| | | | | | 378/119 |
| 2009/0259129 | A1 * | 10/2009 | Wang | ....................... | A61N 7/00 |
| | | | | | 600/459 |

(Continued)

OTHER PUBLICATIONS

Mueller et al., "Design of an electron microscope phase plate using a focused continuous-wave laser", New Journal of Physics, vol. 12, No. 073011, Received Feb. 23, 2010, 10 pages.

(Continued)

*Primary Examiner* — Nicole M Ippolito
(74) *Attorney, Agent, or Firm* — Womble Bond Dickinson (US) LLP; Daniel E. Ovanezian

(57) ABSTRACT

An optical cavity is defined by a first mirror and a second mirror. The first mirror has a front surface that includes a first concave mirror. The second mirror has a front surface that includes a second concave mirror. The optical cavity has a resonant optical mode with a small focal spot size. The optical cavity may be used in a method of enhancing phase contrast in an electron beam image, and associated system for electron beam imaging or electron-beam spectroscopy, with a transmission electron beam microscope.

20 Claims, 8 Drawing Sheets

(56) References Cited

U.S. PATENT DOCUMENTS

2013/0037712 A1* 2/2013 Glaeser .................. H01J 37/26
250/307
2017/0281102 A1* 10/2017 Ken ..................... A61B 6/4258

OTHER PUBLICATIONS

Schwartz, "Near-concentric Fabry-Perot cavity for continuous-wave laser control of electron waves", Optics Express, vol. 25, No. 13, Jun. 26, 2017, 10 pages.

* cited by examiner

OPTICAL-CAVITY BASED PONDEROMOTIVE PHASE PLATE FOR TRANSMISSION ELECTRON MICROSCOPY

CROSS-REFERENCE TO RELATED APPLICATIONS

This application claims benefit of priority from U.S. Provisional Application No. 62/479,044 filed Mar. 30, 2017, which is incorporated herein by reference in its entirety.

STATEMENT OF GOVERNMENT SUPPORT

This invention was made with government support under Contract No. DE-AC02-05CH11231 awarded by the U.S. Department of Energy under Grant No. DBI-1040543 awarded by the National Science Foundation. The government has certain rights in this invention.

TECHNICAL FIELD

This disclosure relates generally to transmission electron microscopy (TEM) and more particularly to an optical cavity phase plate for TEM.

BACKGROUND

Modern transmission electron microscopes have become powerful imaging tools that achieve a resolution about a thousand times higher than light microscopes; yet, their imaging performance for thin biological specimens remains relatively poor: Such specimens are weakly scattering "phase objects," i.e., they show virtually no absorption of the impinging electrons. As a result, the intensity of the transmitted electron beam remains equal to that of the incident beam, and a perfect image of such objects shows no contrast. Historically, electron microscopes have thus required special preparation of samples in which heavy-metal "staining" provides contrast. These procedures are difficult and time-consuming; moreover, they have been known to alter the structures and thus limit the resolution at which meaningful information can be obtained.

Even for unstained phase objects, the object (specimen) structure is imprinted on the phase of the matter wave describing the transmitted electrons. As discovered for optical microscopes by Zernike, invisible phase modulation can be converted into visible amplitude contrast. The light that passes a specimen is decomposed into an undiffracted component and a diffracted component. The undiffracted light is focused to a bright spot at the center of this plane by an objective lens. The diffracted light is arranged around this center. Diffraction by fine structures of the object leads to a larger diffraction angle. Hence, the diffraction orders that correspond to fine details of the image (i.e., having small dimensions) lie far away from the center, whereas large-scale structures cause diffracted light near the center. Mathematically, the intensity distribution in this back focal plane is given by a spatial Fourier transform of the specimen's transmission, which is referred to as the Fourier transform plane.

If the specimen is a pure phase object, there is a special phase relationship between these components. By offsetting this phase relationship, the phase modulation is converted into amplitude modulation. Maximum conversion, and thus maximum phase contrast, is obtained with a phase shift of 90 degrees, or $\pi/2$. In optics, this is done by a phase plate, which is essentially a glass plate coated so that light passing through a small area in the middle receives an extra phase shift.

Unfortunately, no simple phase plates exist for electron beams, making it hard to view unstained biological specimens. A partial solution is given by cryo-electron microscopy methods. These avoid staining and the associated generation of structural artifacts and generate a certain amount of phase contrast by intentionally viewing the specimens in an out-of-focus condition combined with intentional spherical aberration. By optimizing the tradeoff between the phase distortion due to defocus and that due to spherical aberration, one can achieve the desired conversion of phase into amplitude contrast. However, the phase shifts vary continuously over the spectrum of spatial frequencies. As a result, this "simple" method works well for small features in the image, but contrast for larger features is lost. Since it is necessary to have substantial contrast for large features, too, in order to see biological macromolecules, it is often necessary to use a much larger amount of defocus. Unfortunately, this results in reduced resolution. Also, the contrast transfer function oscillates multiple times in the region of higher spatial frequencies. Defocus is thus an imperfect way to produce phase contrast in images of biological macromolecules.

One conventional technology utilizes a thin carbon film as a phase plate in transmission electron microscopy. The thickness of the film causes the scattered electrons to experience a $\pi/2$ phase shift, whereas the axial electrons pass through a 1 μm diameter central hole. The main disadvantage of this technology is that these phase plates "age" on a time scale of days or weeks. It is also very difficult to fabricate them reproducibly. In addition, a fraction of the useful signal is lost when the scattered electrons pass through the thin carbon film.

More recently, microfabrication techniques have allowed for the construction of electron microscope phase plates. The focused, undiffracted beam is passed through a small hole in an electrode that is biased by tens to hundreds of millivolts, depending upon the particular electrode geometry in the device, thereby resulting in the desired phase shift. Electrostatic shielding of the electrode prevents interaction with the scattered electrons, so that they experience no additional phase.

Another embodiment of a phase plate uses a long, very thin bar magnet that is placed across the electron diffraction pattern, closely adjacent to the undiffracted electron beam. A phase shift is generated by the Aharonov-Bohm effect because of the difference in the magnetic vector potential on either side of the long bar magnet.

All such efforts are currently limited by the short time that it takes for a physical device to become electrically charged, presumably due to a build-up of contamination on the surface when the device is hit by an intense electron beam. This causes unwanted electric fields, which lead to an uncontrolled phase shift in the electron beam at various scattering angles. This effectively makes the images irreproducible and un-interpretable. Also, the electrode blocks the diffracted beams closest to the center, thus reducing the contrast for large structures in the image. Similar problems are faced by thin film phase plates.

SUMMARY OF EMBODIMENTS

In one embodiment, a system for electron beam imaging or electron-beam spectroscopy includes a transmission electron microscope (TEM) having a back focal plane. A plurality of mirrors forms an optical cavity. A focal spot of the optical cavity is positioned at the back focal plane of the TEM. The optical cavity is positioned to allow an electron beam provided by the TEM to pass through the focal spot of the optical cavity. The optical cavity is operable to admit a laser beam. A laser is coupled to the optical cavity. The laser is operable to provide a laser beam of a specified wavelength to enter the optical cavity. The laser beam is reflected from the plurality of mirrors to provide a standing wave optical phase plate. The standing wave optical phase plate is focused at the back focal plane of the TEM, to cause a modulation of the electron beam. An image plane of the TEM is positioned to receive the electron beam modulated by the standing wave optical phase plate.

In one embodiment, a method of enhancing phase contrast in electron-beam image includes generating an electron beam in a transmission electron microscope. The TEM has a back focal plane. The method includes admitting the electron beam along an axis through a center of an optical cavity. The optical cavity is positioned at the back focal plane. The optical cavity is defined by a first mirror and a second mirror. The method includes admitting a laser beam to the optical cavity. The laser beam is reflected from the first mirror and the second mirror, to generate a standing wave optical phase plate. The standing wave optical phase plate is focused at the back focal plane of the TEM, to cause a modulation of the electron beam. The method includes imaging the electron beam in an image plane of the TEM. The image plane is positioned to receive the electron beam modulated by the standing wave optical phase plate.

In one embodiment, a device includes a first mirror and a second mirror. The first mirror has a first front surface that includes a first concave mirror. The second mirror has a second front surface that includes a second concave mirror. The first mirror or the second mirror has a curvature radius of about 5 cm or less. The first mirror and the second mirror define an optical cavity having a resident optical mode with a focal spot size of about 30 µm or less.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
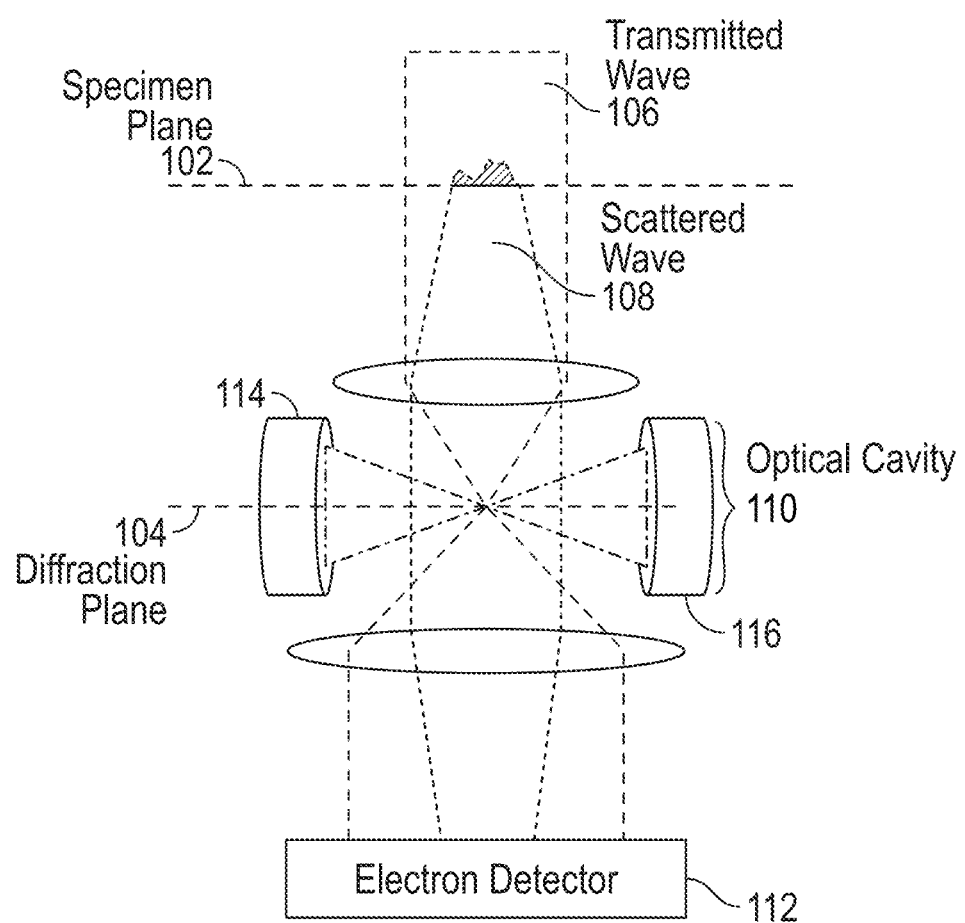
FIG. 1 depicts schematic geometry of an embodiment of the phase contrast TEM. A narrow-waist optical cavity mode is focused in the back focal plane of the TEM objective lens, applying retardation to the transmitted wave but not to the scattered wave.

Embodiments of a laser phase plate with an optical cavity, and phase contrast transmission electron microscopy using the laser phase plate are described herein. Examples of these specific embodiments are illustrated in the accompanying drawings. While specific variations are described in conjunction with these specific embodiments, it will be understood that it is not intended to limit to the described embodiments. On the contrary, it is intended to cover alternatives, modifications, and equivalents as may be included within the spirit and scope as defined by the appended claims.

In the following description, numerous specific details are set forth in order to provide a thorough understanding of the present embodiments. Particular example embodiments may be implemented without some or all of these specific details. In other instances, well known process operations have not been described in detail in order not to unnecessarily obscure the present disclosure.

Various techniques and mechanisms of the present embodiments will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

Described herein is an optical power amplification cavity that is suitable for use as a phase mask for an electron beam in an electron-based imaging system or an electro-based spectroscopy system, such as a transmission electron microscope (TEM). Depending on the configuration, such a phase mask can serve as a number of electron-optical elements for coherent manipulation of electron beams, including:

- a phase plate for Zernike-type phase contrast electron microscopy;
- a Bragg beam-splitter for coherently splitting an electron beam in two, with controllable splitting ratio;
- a transmission diffraction grating for electron beams, splitting an input beam into a number of diffraction orders;
- a temporal phase modulator analogous to an electro-optical modulator used in conventional light optics;
- a local temporal phase modulator, which, in conjunction with an energy filter, can be used as a beam stop for dark-field electron microscopy;
- a spatiotemporal phase modulator analogous to acousto-optical modulator (deflector) used in conventional light optics.

The design of one embodiment of the power amplification cavity includes cavity mirrors (e.g., spherical dielectric mirrors), at least one of which is characterized by a highly curved front surface. The front (concave) surfaces of the mirrors have a reflective coating disposed thereon. The back (convex) surfaces of the mirrors may have an antireflective coating disposed thereon. The intra-cavity laser field configuration creates an effective potential for electrons, which imprints a spatially patterned phase shift, which can also be temporally modulated, onto the electron beam transmitted through the cavity.

Advantages of an optical-cavity electron-optical elements over conventional elements based on material structures (e.g., optical-cavity phase plate over material phase plate) include (1) the amount of phase shift remains substantially constant and does not change with the length of time that the phase plate is used, as is the case for every previous device that brings physical objects near to or into the electron beam; (2) the amount of phase shift can be adjusted as desired to "tune" the phase shift from about zero degrees to 360 degrees; (3) negligible electron loss (undesired electron scattering) in optical-cavity elements.

Advantages of the optical-cavity electron-optical elements over elements based on pulsed laser systems include that the optical-cavity phase plate can be used with continuous electron-illumination rather than a pulsed electron-gun (as in a previous pulsed-laser phase plate). This feature makes the optical-cavity phase plate uniquely suitable for use in standard, continuous electron-emission microscopes and for applications in which very high electron exposures are used. A cavity-based system also is characterized by a precisely controllable phase shift pattern, determined by the laser field configuration of the cavity mode. The absence of distortions and imperfections typically present in a laser beam profile is highly desirable to avoid unwanted scattering of electrons due to laser field irregularities.

Features of an optical-cavity phase plate may include:
- a near-concentric Fabry-Pérot cavity configuration, or another cavity configuration featuring a high intensity focal spot;
- a highly reflective dielectric coating on a curved surface;
- an arrangement of three or more piezoelectric actuators to align the cavity and to control the cavity mode shape;
- a phase plate for TEM characterized by a phase shift profile that need not be a single spot but rather an extended pattern with multiple maxima and minima, which leads to a contrast transfer function suited to a particular purpose (e.g., a standing wave pattern with a waist of a few wavelengths may be used as a Zernike phase plate, while a larger waist is preferable to function as a Bragg beam splitter);
- a phase plate for TEM based on electron-light interactions—one embodiment is a near-spherical cavity with high-finesse, high numerical aperture (high-NA) mirrors;
- mirrors with back surface (convex) concentric with the front (concave) surface for efficient coupling into cavity modes;
- mirrors with the back surface having a reflection-reducing coating disposed thereon for increased coupling efficiency;
- simultaneous input into the cavity of laser fields at several supported (resonant) frequencies to achieve temporal modulation and temporal control of the phase pattern applied to the electron beam.

Feedback and alignment mechanisms and methods for an optical-cavity phase plate may include:
- a feedback mechanism to keep the mode shape and size stable (e.g., with a charge-coupled device (CCD) camera and/or a segmented detector monitoring the transmitted beam, the reflected beam, or both);
- feedback topology in which the laser frequency is kept locked to the cavity, following both fluctuations and systematic changes in the cavity length, or, alternatively, the cavity length is changed to keep the resonance frequency of the cavity locked to the laser frequency;
- a method of aligning the cavity to the electron beam by monitoring the TEM images, the Fourier transforms of the TEM images, or other mathematical constructs to determine the degree of misalignment and provide feedback for alignment;
- feedback to the cavity mode can aid in keeping the laser phase plate aligned to the beam;
- using the laser beam transmitted through the cavity to inject the master laser (e.g., as a frequency locking mechanism).

Further features of an optical-cavity phase plate may include:
- heat pipes to remove heat from the cavity;
- a heat shield to protect cavity structure;
- control cavity length by temperature;
- controlling the mirror curvature by controlled pre-heating with an auxiliary laser, a heating circuit, or a thermoelectric device;
- use of near-IR wavelength;
- using a multi-cavity arrangement to decrease spot size and increase intensity;
- using an optical fiber to bring the laser to the cavity;
- using an optical isolator to protect the laser system from reflected light;
- the laser focal size being larger than the electron focal size to avoid scattering of the electron beam;
- controlling the configuration of the intra-cavity field by deforming (e.g., gently squashing) the mirrors.

Additional applications/features may include:
- Variation of the laser power to tune the amount of phase shift. This feature can be used to invert or otherwise adjust the contrast.

The optical-cavity phase plate can be used for high electron doses in a TEM. A Volta phase plate generally cannot be used for high electron doses.

Rapid modulation of the phase shift can be achieved by modulating intra-cavity laser power. This leads to a modulated electron wave function that can be used to deliver an oscillating or pulsed electromagnetic field to a microscopic object (i.e., a form of spectroscopy).

A side-band formation in the focal spot in combination with an energy filter can be used to effectively stop the transmitted (i.e., undiffracted) electron beam for full-field dark-field TEM.

Lossless, controllable electron beam splitter.

Various embodiments have some or all of the following features:

At least one of the mirrors has a reflective surface with a radius of curvature of 5 cm or less to create a small focal point inside the cavity.

The reflectivity of each of the mirrors comprising the cavity is about 0.9 or greater.

The mirrors comprising the cavity have a reflective surface coated with a reflective dielectric coating.

The plurality of mirrors comprises a first mirror and a second mirror.

A cavity housing, wherein the optical cavity is positioned in the cavity housing, wherein one or more of the mirrors comprising the cavity are mounted in adjustable suspensions, and wherein the adjustable suspension is operable for adjustment of the angle and position of the mirrors.

The adjustable suspension includes piezoelectric actuators.

The power of the laser beam is amplified by the cavity by a factor of about 10 or more.

In some embodiments, the geometry of the back surface of the mirrors (i.e., the nonreflecting surface) may not be critical, and may not need to be a convex surface that is concentric with the front surface of the mirror. For example, the back surface of one or both of the mirrors could be flat. One feature that defines the cavity suitable for the phase plate (as opposed to a generic optical cavity) in some embodiments is the cavity being able to focus the beam to a small focal spot, while simultaneously being able to amplify the laser power by a large factor, and withstand the resulting high power. This is not seen in known optical cavities. The features present in an optical cavity for present embodiments include (1) short curvature radius of at least one of the mirrors, and (2) low roundtrip loss, which amounts to high reflectivity/low absorption of all mirrors.

An advantage of an optical-cavity phase plate in cryo-electron microscopy (cryo-EM) is that the amount of phase contrast can be 100% of a specified value at the beginning of data collection. Further, the amount of phase contrast can remain at the specified value throughout the period of data collection, which can extend for 24 hours or more per cryo-EM session. This means that all portions of the data collected would be of equal quality, as opposed to some data being much worse than other data. Further advantages of an optical-cavity phase plate include greater versatility and reliability. Yet further, it is theoretically expected that a phase shift of 270 degrees rather than 90 degrees will result in better performance.

Further details regarding the operation of an optical-cavity phase plate in accordance with one embodiment is described in U.S. patent application Ser. No. 13/487,831, filed Jun. 4, 2012, which is herein incorporated by reference.

Transmission electron microscopy (TEM) of unstained flash-frozen biological specimens (cryo-EM) has recently become a major source of structural information in molecular biology. The lower limit on the molecular weight of accessible particles has been reduced to 100-200 kDa, and in some cases below 100 kDa. Theoretical considerations suggest that reconstruction of particles down to about 40 kDa should be possible. Nevertheless, determining the structure of macromolecular complexes with sizes between 40 and 100-200 kDa, as well as addressing larger, but flexible complexes, requires further improvement of the cryo-EM technology.

One avenue toward TEM reconstruction of smaller particles is the development of a Zernike phase plate, which allows for phase-contrast imaging without defocusing. An important step in this direction (FIG. 2) has been the development of the "Volta" phase plate.

Significant opportunities for further improvement, however, remain. In the Volta design, the phase shift is induced by exposure of an amorphous carbon foil to the electron beam and keeps increasing during the data collection. Only a moderate number of images can be taken while the phase shift is in the useable range of 40-120°; then, the carbon film has to be moved to expose a fresh spot. Many images must be taken at a non-optimal phase shift. The phase shift and its drift rate vary from spot to spot even within the same phase plate. These properties make it difficult to use carbon-foil phase plates in cryo-EM structural studies, which require high throughput image acquisition with consistent parameters.

Placing material structures in the path of a high-energy electron beam inevitably leads to charging and deterioration. Time-varying behavior is therefore an unavoidable drawback of phase-contrast devices based on material objects in the electron stream of a TEM. As a side drawback, there is a small but appreciable 18% electron scattering in a Volta phase plate.

Here, it is proposed to escape this limitation by using an intense laser focus as an electron wave retarder. Such a laser-based, or 'ponderomotive', phase plate does not involve material objects inserted into, or located close to, the electron beam. It can apply a constant phase shift indefinitely, has a predictable and reproducible contrast transfer function, and features virtually no electron loss. The phase shift can be varied as desired by varying the laser power.

A central idea in various embodiments is that a laser beam focused in the back focal plane of a TEM objective lens 1018 (see embodiment in FIG. 10, described in further detail below) can be used to retard the phase of the transmitted wave relative to the scattered wave, acting as a Zernike phase plate. A controllable, stable phase shift offered by the laser phase plate will allow the cryo-EM community to take full advantage of improved image contrast in Zernike phase-contrast TEM.

The physical mechanism of electron retardation is described below. A goal for presently described embodiments is to build a better Zernike (quarter-wave) plate for phase contrast TEM by controlling the phase of the electron wave with lasers. This concept is borrowed from the field of atomic physics, where lasers are used to manipulate both the motional and the internal degrees of freedom of ensembles of cold atoms. These methods have enabled numerous experiments aimed at testing the foundations of quantum mechanics and general relativity, the search for the fields responsible for dark energy, and precision measurements of fundamental constants.

The physical principle behind laser-based coherent control of electron waves can be described in terms of classical physics as follows. A relativistic electron travelling through an intense oscillating laser field experiences small-scale quiver motion, resulting in an effective 'ponderomotive' potential. This potential is described by the following expression:

$$V_{pond} = \frac{eI}{2m\varepsilon_0 c\omega^2}, \quad (1)$$

where I is the laser intensity, e and m are electron's charge and mass, $\varepsilon_0$ is the permittivity of vacuum, c is the speed of light, and $\omega$ is the optical frequency. This repulsive potential imparts a negative phase shift (retardation) to a passing electron.

A more rigorous description of the interaction of a relativistic electron with an intense laser beam can be given in terms of quantum electrodynamics (QED), where the phase shift is attributed to stimulated Compton scattering. In this process, an electron either absorbs a photon from the laser beam and then reemits it via stimulated emission induced by the same beam, or undergoes these two events in reverse. An electron experiencing stimulated Compton scattering on a monochromatic laser beam emerges with the same energy it started with, without losing coherence. In contrast, spontaneous Compton scattering causes the electrons to lose coherence, but the fraction of electrons experiencing such events is of the order of $10^{-7}$ under conditions relevant to various embodiments. We note that electrons can also be scattered inelastically, thereby losing coherence, via higher order scattering processes, involving three or more photons. However, these processes are not expected to become important until the laser intensity reaches $I \approx 10^{13}$ W/cm$^2$ (for a laser wavelength of 1 μm), far exceeding the intensity dealt with in present embodiments.

Required laser intensity is described below. The proportionality coefficient between the ponderomotive potential and the laser intensity in Eq. (1) is small, calling for a high laser intensity. For an electron beam passing orthogonally through a focused Gaussian beam, with a power P, and a focus waist $w_0$ (the beam radius measured at $1/e^2$ of the peak intensity), the phase shift is:

$$\varphi = \sqrt{8\pi} \frac{\alpha}{\beta\gamma} \frac{P}{mc\omega^2 w_o} \quad (2)$$

where $\alpha$ is the fine structure constant, $\beta = v_e/c$, $v_e$ is the electron velocity, and $\gamma = (1-\beta^2)^{-1/2}$. To estimate the necessary optical power, electron energy U=300 keV is substituted as typically used in cryo-EM studies. According to eq. (2), for a laser wavelength $\lambda$=1064 nm, and a beam waist of $w_0$=7 μm, the laser power required to achieve a full 90° phase shift is P≈300 kW.

Figure 10:
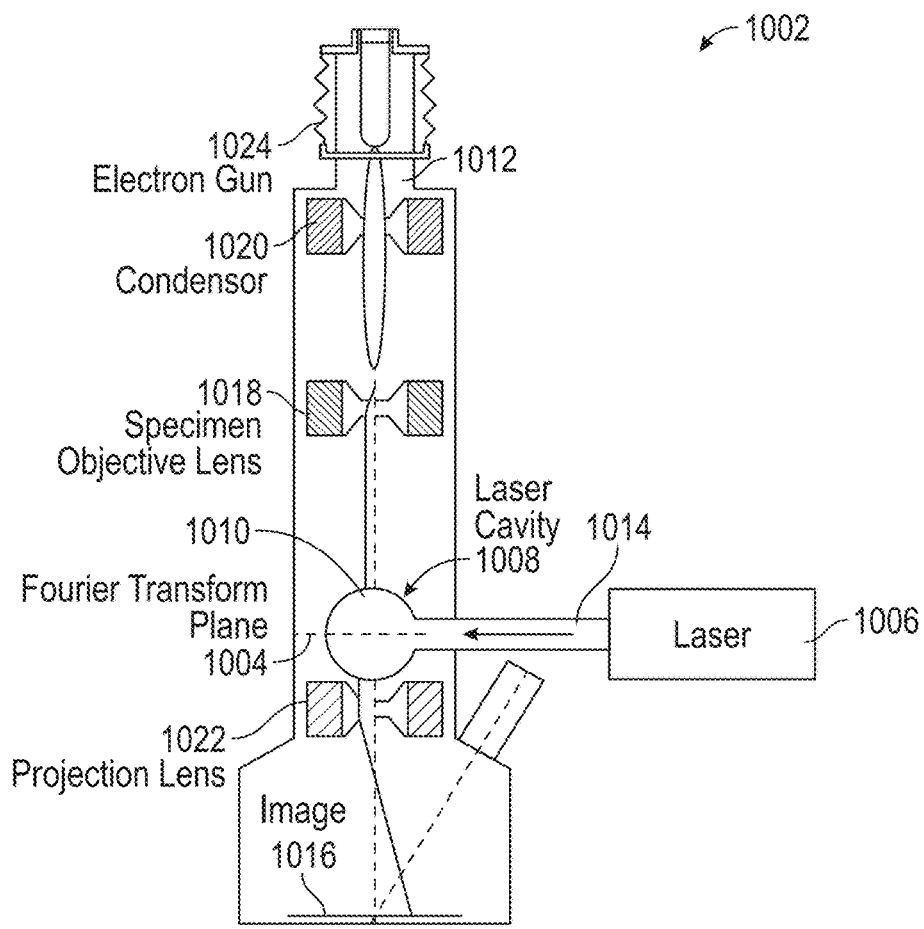
FIG. 10 shows one embodiment of a transmission electron microscope including an optical-cavity phase plate according to an embodiment of the disclosure.

Achieving such optical power is straightforward with a pulsed laser system, but a pulsed phase plate would also require a synchronized pulsed electron gun 1024 (see FIG. 10). The principal goal of present embodiments is to develop a laser phase plate based on a continuous wave (CW) laser system, compatible with conventional cryo-EM equipment.

Resonant field enhancement in an optical cavity is described below.

FIG. 1 depicts schematic geometry of an embodiment of the phase contrast TEM. A narrow-waist optical cavity mode is focused in the back focal plane of the TEM objective lens, e.g., diffraction plane 104, applying retardation to the transmitted wave 106 but not to the scattered wave 108. Electrons from the scattered wave 108 are detected by the electron detector 112, and imaged with increased contrast viewing of a specimen in the specimen plane 102 as a result of the retardation in the transmitted wave 106.

In some embodiments, laser intensity is built up by resonance in a high-finesse, near-concentric Fabry-Pérot cavity (see optical cavity 110, in FIG. 1). This type of resonator features an hourglass-shaped fundamental mode, with a small waist and a large spot size on the mirror 114, 116 surface. The small waist concentrates the power into a high-intensity focal spot and confines the phase shift to a narrow region around the focus of the transmitted wave 106. The large spot size on the mirrors 114, 116 prevents laser-induced breakdown of the mirror coatings and helps spread the thermal load over a wider area. Furthermore, the two counter-propagating waves in the Fabry-Pérot cavity form a standing wave, with intensity quadrupled in the antinodes. With a wavelength $\lambda$ of 1064 nm, and a beam waist w0=7 μm, an intra-cavity circulating power 204 of P=75 kW is sufficient to reach a full 90° phase shift.

In recent work towards the above-identified goals, a near-concentric cavity was demonstrated operating at a wavelength of $\lambda$=1064 nm, with a finesse of F=22,000. The sensitive alignment of the near-concentric cavity was performed using a specially designed flexure-based mount with three piezo-actuators, which allowed reaching a waist of 7 μm (radius at 1/e2 intensity).

Figure 2:
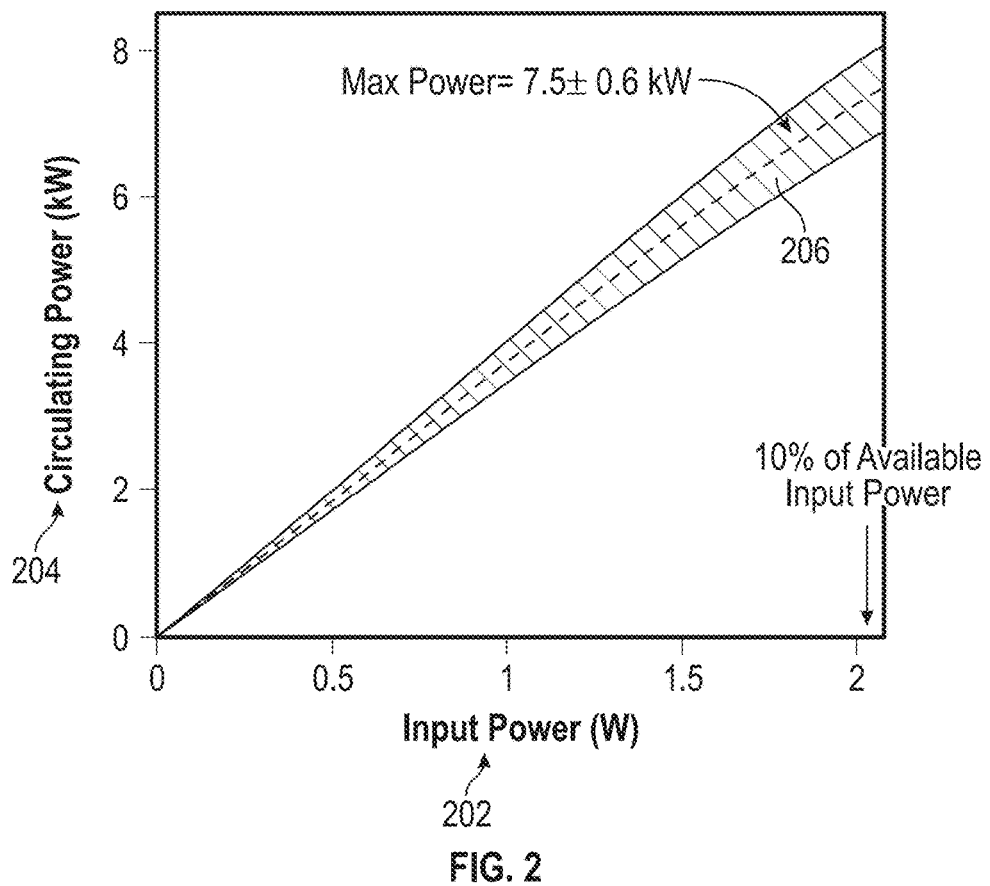
FIG. 2 depicts experimentally measured dependence of the intra-cavity circulating power on the input laser power. Gray shading represents the measurement uncertainty.

FIG. 2 depicts experimentally measured dependence of the intra-cavity circulating power 204 on the input laser power 206. Gray shading 206 represents the measurement uncertainty. At an input power 202 of P_0=2.2 W, the cavity reached a circulating power 204 of P=7.5 kW, corresponding to a record CW optical intensity of 40 GW/cm2 (see FIG. 2). The phase shift corresponding to these beam parameters is 9.2° for a 300 keV electron beam. A realistic tenfold power increase would thus be sufficient to reach the goal of providing a 90° phase shift.

Laser field configuration and the contrast transfer function is described below.

Figure 3:
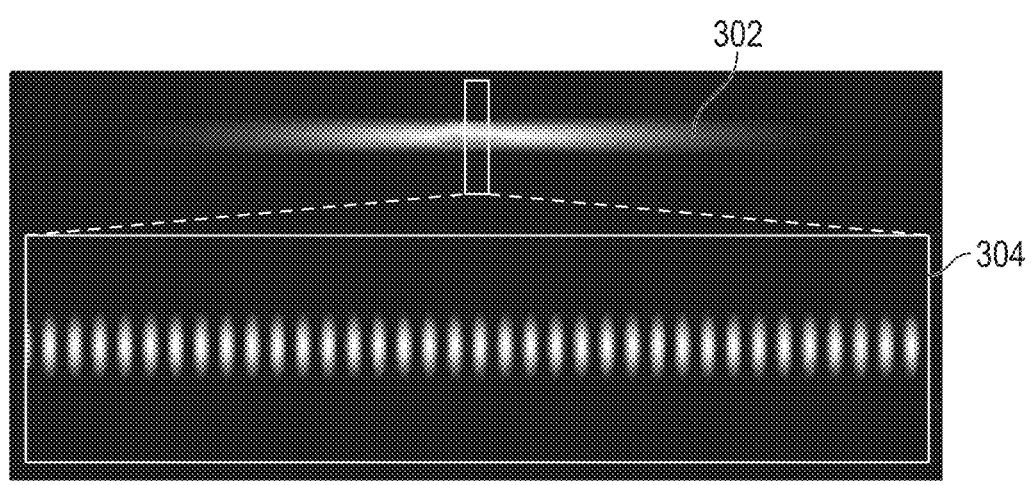
FIG. 3 depicts the intensity distribution of the fundamental mode of a near-concentric Fabry-Pérot cavity. The inset, stretched in the horizontal direction, shows the fringes of the standing wave.

FIG. 3 depicts the intensity distribution 302 of the fundamental mode of a near-concentric Fabry-Pérot cavity. The inset 304, stretched in the horizontal direction, shows the fringes of the standing wave. In an ideal Zernike phase plate, a 90° retardation is applied only to the transmitted wave, focused in the center of the electron-diffraction plane 104, with no phase shift in the rest of the plane. A present embodiment of the cavity-based laser phase plate has a Gaussian standing-wave intensity profile (shown in FIG. 3), applying a harmonically modulated phase shift to a stripe-shaped region of the diffraction plane 104. Consequences of this phase profile, and why this phase plate serves effectively as a Zernike phase plate in cryo-EM single particle analysis are discussed below.

Phase contrast extends to sufficiently low spatial frequencies to image small protein complexes (~5 nm or less). The "cut-on" frequency at which phase contrast becomes effective is determined by the contrast transfer function (CTF) of the imaging system. The correspondence between the spatial frequency v and the radius r in the back focal plane of the TEM objective is $$r = vf\lambda_e, \quad (3)$$

where f is the focal length of the objective lens of the TEM and $\lambda_e$ is the electron wavelength. The typical parameters for microscopes used in cryo-EM are $\lambda_e$=1.97 pm (corresponding to an electron energy of $U_0$=300 keV) and f=2.5 mm. For the initial stages of development of embodiments, including the development of the first prototype and initial data collection, a custom-modified FEI Titan TEM was used, in which relay optics have been added in order to magnify the electron diffraction pattern at the plane of the phase plate. This additional magnification produces an effective focal length of f=20 mm, which relaxes the requirement for tightness of the laser focus.

Figure 4:
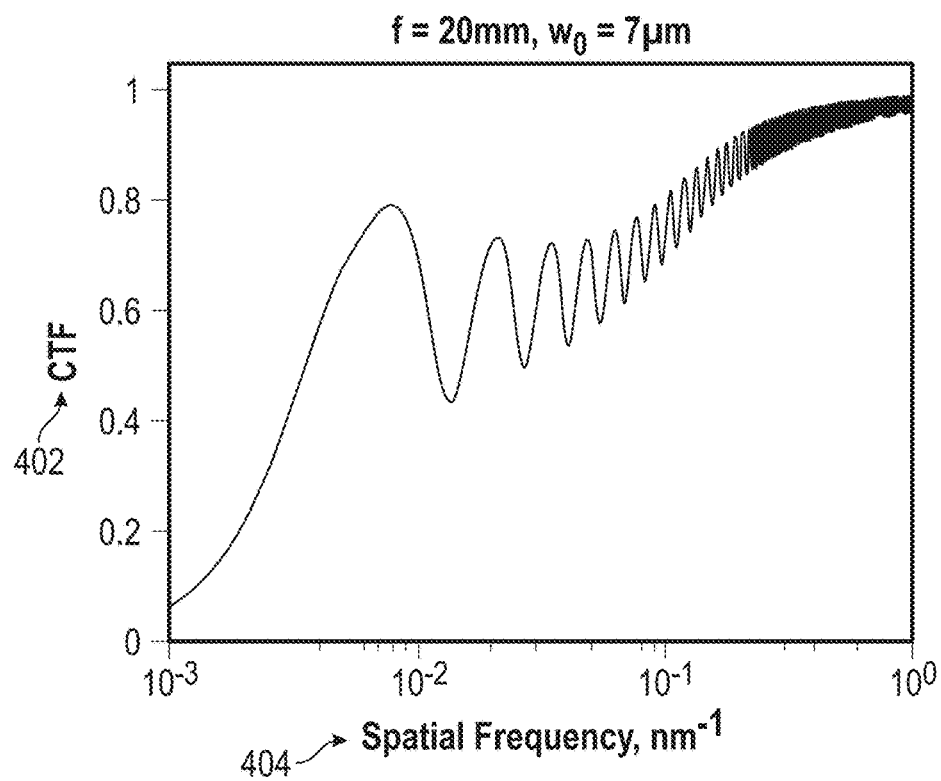
FIG. 4 depicts the contrast transfer function (CTF) of a TEM with a cavity-based laser phase plate, averaged over the azimuthal angle.

FIG. 4 shows the in-focus CTF 402 of a cavity-based phase contrast TEM, averaged over the azimuthal angle, calculated for an electron microscope. For clarity, this graph shows CTF at zero defocus and with spherical aberration not taken into account. For very low spatial frequencies 404, the curve starts out at zero contrast. CTF 402 reaches 50% at spatial frequencies 404 as low as 1/(240 nm), a scale set by Eq. (3) with r=$\lambda$/2 representing the size of a standing-wave fringe (see FIG. 2). The oscillations are caused by the fringes of the standing laser wave. The CTF reaches nearly full (>80%) contrast at frequencies larger than 1/(10 nm), a scale set by the radius of the laser beam. Thus, for particles of the size D$\approx$0.5 $v^{-1}$=5 nm or smaller, the information contained in the electron phase is transmitted with nearly maximum contrast. Many macromolecules with a molecular weight below 100-200 kDa have diameters about 5 nm or less. The cavity-based phase plate provides near-ideal contrast for them. Even much bigger particles (100 nm) are imaged with only moderate reduction of contrast.

Image artifacts due to the standing-wave phase profile do not significantly distort particle images. Multislice numerical modeling of cryo-EM imaging of hemoglobin, a 64 kDa particle, embedded in 30 nm of amorphous ice, confirms that a cavity-based phase plate would work well for small particles. The structure of the hemoglobin molecule was downloaded from the protein databank. A dose of 20 e/Å$^2$ was used. The resulting images show a significant increase of contrast with the laser phase plate, compared to the defocused image, made with underfocus of 1 μm.

Numerical modeling allows evaluation of possible artifacts due to the anisotropic phase shift profile of the laser wave plate. Studies of images, including an image of hemoglobin simulated with an ideal phase plate that would phase-shift only the transmitted wave and an image with a cavity-based laser phase plate were conducted. The simulation highlights any differences by not showing the shot noise or the noise from ice density fluctuations. Even so, only slight vertical streaking can be discerned. Simulation showed the difference between the two images in a gray scale that amplifies the difference signal tenfold to a visible level. The difference is far below the noise level, and is therefore not expected to affect particle identification and classification.

Another side effect of the standing wave phase shift pattern is that it acts as a diffraction grating for the electron wave, generating additional weak 'ghost' images. These ghost images are displaced from the primary image by a distance $\delta x = 2nf\lambda_e/\lambda$, where n is the diffraction order, f is the focal distance and $\lambda_e$ is the electron wavelength. Even for a full 90° shift, the amplitude of such ghost images is well below the shot noise for an irradiation of 20 e/Å2. In a dense specimen, overlaps between a ghost image of one particle and a primary image of another can be expected to occur. However, ghost images are too weak to be visible in individual micrographs, and can be expected to be averaged out from the merged data, resulting in an insignificant contribution to the noise in the averaged images used for density map reconstruction.

A tighter laser focus is needed to adapt the laser phase plate to standard cryo-EM system. At a later stage, embodiments were developed including an advanced phase plate prototype with a narrower focus, suitable for use with regular TEM systems with a typical focal length f=2.5 mm. To this end, the numerical aperture of the cavity mode is increased, operating the cavity closer to concentricity. In one approach, it was unclear whether this would compromise the cavity finesse. In another approach, a multi-cavity configuration was used, which carries less risk but involves additional steps of alignment and frequency-locking of the cavities. Both plans are described in the "Approach" section.

In summary, it was proposed to develop a Zernike phase plate for a TEM operating at 300 kV, based on the ponderomotive potential of a high-intensity CW laser field circulating inside an optical cavity. It has been demonstrated that a laser intensity sufficient for a ~9° phase shift, and a tenfold increase (which would provide the optimal 90° phase shift) is within reach with the latest mirror manufacturing technology. Numerical simulations show that the cavity-based phase plate can be effectively used as a Zernike phase plate for cryo-EM single particle reconstruction. Approaches are detailed below and include a continuous-wave laser phase plate module, with sufficient laser intensity to shift the phase of a 300 keV electron beam by 90°.

Building a laser phase plate based on a near-concentric cavity requires custom-built, highly curved cavity mirrors with high reflectivity and low loss. In addition, an appropriate feeding laser, as well as an optomechanical system for maintaining the cavity alignment are employed. Embodiments of the system also should be compact, vacuum-compatible and non-magnetic to operate inside a TEM column. Strategy for building a system meeting these requirements is outlined below.

Embodiments of the laser system are described below.

Figure 5:
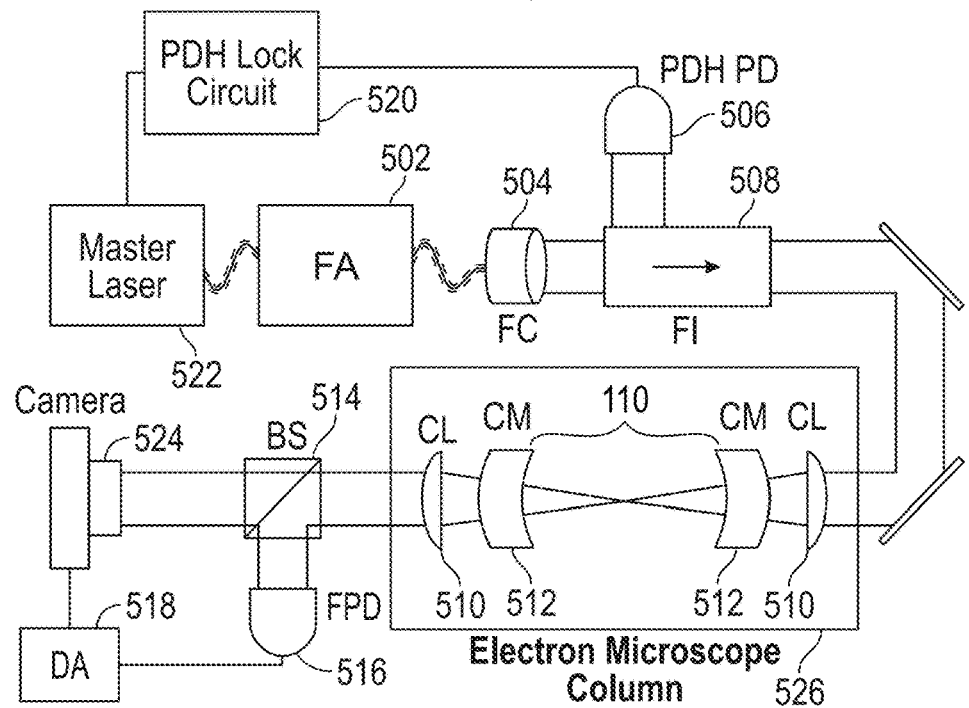
FIG. 5 is a schematic diagram of an embodiment of the laser system, including the cavity and the coupling optics inside the electron microscope column, the feeding laser system, and the cavity characterization tools.

FIG. 5 is a schematic diagram of an embodiment of the laser system, including the cavity 110 and the coupling optics inside the electron microscope column 526, the feeding laser system, and the cavity characterization tools. For the acronyms of components of the system, FA=fiber amplifier 502, FC=fiber coupler 504, PDH PD=Pound-Drever-Hall lock photodiode 506, FI=Faraday isolator 508, CL=coupling lens 510, CM=cavity mirror 512, BS=beamsplitter 514, FPD=fast photodiode 516, and DA=digital data acquisition 518, e.g. of data from the camera 524 and the fast photodiode 516. In one embodiment, the Nd:YAG laser wavelength (1064 nm) was chosen, which allowed taking advantage of the commercially available narrow-linewidth lasers and highly optimized optical coatings. A low-power (<100 mW) master laser 522 is amplified with an Ytterbium fiber amplifier (FA) 502 by IPG Photonics or Nufern. This provides single-mode, single-frequency, polarization-maintaining (PM) amplification up to 50 W.

The laser beam is coupled into a high-power, single mode, PM fiber from NKT Photonics, capable of conducting at least 20 W of optical power at 1064 nm. The power is delivered to a small assembly that is attached to the microscope, which houses a Faraday insulator (to prevent laser radiation from being reflected back into the laser) and beam steering mirrors (to match the fiber output spatially to the cavity mode). A camera 524 and a photodetector, e.g., FPD 516, observe the mode shape transmitted by the cavity 110 for optimization purposes and for measuring the cavity finesse using cavity ring-down spectroscopy.

The master laser frequency is stabilized ("locked") to the resonance of the optical cavity 110 using the Pound-Drever-Hall method, as demonstrated in recent work. For this purpose, a portion of the light that is reflected from the cavity 110 is detected by a photodetector (PDH PD) 506 and used by the PDH lock circuit 520 to control the laser frequency.

Cavity mirrors 512 are described below. For a Fabry-Pérot cavity made of two identical mirrors 512, the power amplification factor M is determined by the cavity mirror transmission and reflection coefficients T and R, and the mode overlap integral Q:

$$M = |Q^2| \frac{T}{(1-R)^2} \quad (4)$$

Since $|Q| \le 1$, the power enhancement is limited by the quality of the cavity mirrors: the reflectivity has to be as close to unity as possible, and transmission has to be as high as possible. The two coefficients are constrained by energy conservation to $R+T+L=1$, where the loss $L=S+A$ comprises scattering S and absorption A. The absorption is generally a property of the dielectric materials used to produce the mirror coating. Absorption is typically below 3 parts per million (ppm) in the near infra-red reflective coatings produced by ion beam sputtering (IBS) by companies such as Advanced Thin Films, Inc. and Research Electro-Optics (both in Boulder, Colo.).

The scattering, on the other hand, depends mostly on the smoothness of the mirror substrate, and it is therefore determined by the quality of the mirror polishing process. It can be approximated as $S=(4\pi\delta h)^2/\lambda^2$, where $\delta h$ is the root-mean-square (RMS) surface roughness. The methods for polishing flat fused silica substrates are so well developed that the surface roughness of less than 0.1 nm, and scattering of the order of 3 ppm is routinely achieved. However, polishing of high-curvature concave mirrors necessary for a near-concentric cavity remains challenging.

One embodiment takes advantage of a recently developed polishing process, which allows reaching an RMS surface roughness of about 0.1-0.2 nm on substrates with a curvature radius as short as 10 mm. This should result in S well below 10 ppm. In one embodiment, the mirrors 512 are coated with a state of the art highly reflective IBS coating either at Advanced Thin Films or Five Nines Optics. Based on these figures, these mirrors support amplification factors in the range of M=8,000-13,000.

If the IBS coating processes used by the coating companies mentioned above does not perform well on the novel substrates produced by Perkins Precision, one plan is to purchase mirrors 512 with sufficiently small curvature radius that are available from Layertec and LaserOptik. Their reflectivity is expected to be sufficient for reaching an amplification factor of M=4,000-6,000. If neither company should be able to reach the performance goals they specified in their offers, there is a second fallback option, to purchase mirrors 512 with a larger curvature radius available from Advanced Thin Films, which can support a mode waist of 8-10 μm, with a power amplification factor of 10,000.

The mirror transmission coefficient will be measured directly prior to installation in the cavity 110. The reflectivity of the mirrors 512 will be measured using a ring-down spectroscopy technique utilized for this type of cavity.

With a cavity amplification factor of M=5,000, an input power of 15 W is needed to get to a full 90° phase shift. Even at full 75 kW of circulating power, the direct laser damage of the mirror coatings is unlikely: using mirrors 512 with a curvature radius of Rcurv=20 mm, the spot diameter on the mirror surface is $w1=(f\lambda)/(\pi w0)=1$ mm, leading to a maximum surface intensity of less than 0.5 MW/cm2, well below the laser damage threshold for a high-reflectivity mirror coating in the near infra-red range; for example, an intensity of 100 MW/cm2 has been achieved.

The large mode size on the mirror surface makes it necessary to pay special attention to the surface quality, as any blemish in the central part of the mirror 512 will increase the round-trip loss. This risk can be mitigated by specifying surface quality of scratch-dig of 10-5 or better, and by ordering mirrors in batches of 10 or 12 for selecting the best-performing mirrors.

Cavity optomechanics is described below.

Figure 6:
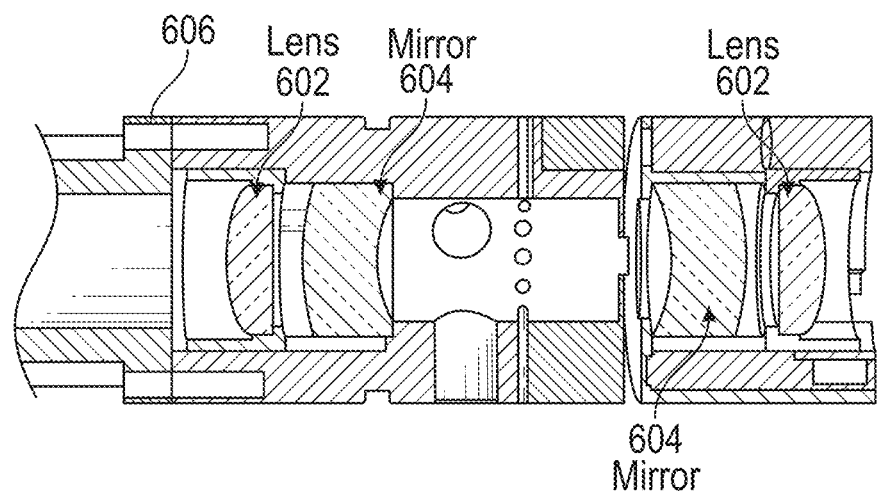
FIG. 6 is a cross-section drawing of the optical cavity, including the housing, cavity mirrors, and coupling aspherical lenses, in one embodiment.

FIG. 6 is a cross-section drawing of the optical cavity, including the housing 606, cavity mirrors 604, and coupling aspherical lenses 602, in one embodiment. The optics on the right are positioned in a flexure suspension, which can be tilted or moved in the axial direction.

Alignment of a near-concentric resonator with a small mode waist is extremely sensitive to the position and orientation of the mirrors 604 to each other, as the desired configuration is very close to the degeneracy point, where a series of modes have the same frequency and the resonator becomes unstable. In this configuration, a small angular shift of a mirror 604 causes a significant lateral displacement of the mode. In a near-concentric optical resonator, the mode waist size can be controlled by tuning the distance between the mirrors 604, which needs to be done with sub-micron precision.

Figure 7:
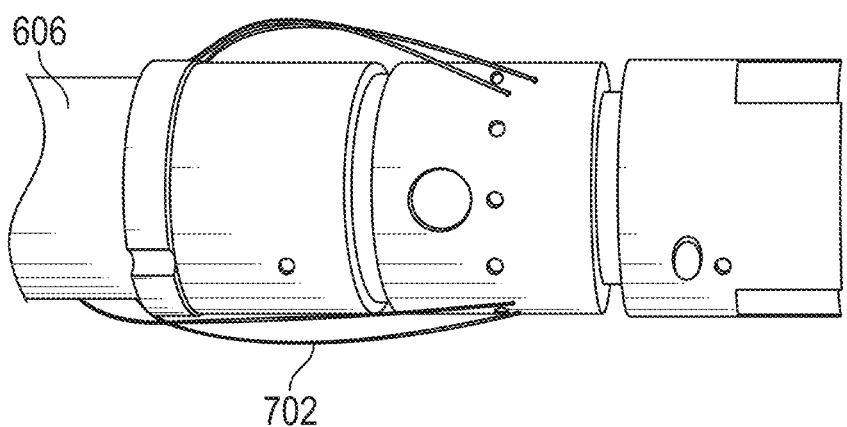
FIG. 7 depicts the cavity mount, in one embodiment. The wires shown connect to the piezo actuators used for precise alignment of the cavity mirrors.

FIG. 7 depicts the cavity mount, in one embodiment. The wires 702 shown connect to the piezo actuators (internal to the housing 606) used for precise alignment of the cavity mirrors 604.

For various embodiments, it was planned to replicate the cavity mount used in previous work on near-concentric resonators, see FIGS. 6 and 7. It was demonstrated that a flexure suspension carved out of a single aluminum block can be used to align a near-concentric cavity with a mode waist $w_0$=7 μm. The mount was sufficiently compact to allow for installation into a TEM column using a cylindrical access port of Ø25 mm in diameter. For the optical bench experiments, the cavity 110 was placed inside a compact vacuum chamber, with anti-reflection coated laser-quality input and output optical ports. One of the mirrors 604 was stationary in the mount, while the position of the second mirror 604 was controlled using three piezo actuators, paired with three fine-threaded screws for coarse alignment. The entire mount assembly was made of non-magnetic materials (Aluminum body, type 316 stainless steel screws with silicon carbide tips, piezo ceramics).

Heat control is described below. Operating under vacuum creates an additional challenge in removing the heat dissipated in the cavity. The absorption in the IBS coated mirrors is only 1-3 ppm of the circulating power, so each of the two cavity mirrors 604 needs to dissipate up to 200 mW in resonance. Care should be taken to remove the heat deposited in the cavity mirrors to avoid thermal deformation. Numeric simulations show that the thermal conductivity of the fused silica substrate limits the temperature increase in the center of the mirror to approximately 30 K, which, according to communications with the mirror manufacturers, is highly unlikely to cause mirror damage.

The local temperature increase will also cause an increase of the local radius of curvature of the order of δR~300 nm. As the cavity 110 is brought to the operating power, the distance between the mirrors 604 will be increased by 2δR to keep the cavity 110 at the chosen distance to concentricity (which determines the mode waist). Changing cavity length will decrease its resonance frequency by ~7 GHz. Since the master laser used in one embodiment (NP Photonics Rock fiber laser module or equivalent) has a frequency tuning range of about 30 GHz, the shift of the resonance frequency can be followed easily by the frequency-locked master laser.

However, additional heat load arises from the light scattered on the mirror surface, which ends up absorbed in the cavity. Given that at least a half of the input power will be either transmitted or reflected, there is a need to be able to remove up to 10 W dissipated in the laser module. This task is made more difficult by the fact that the cavity needs to be suspended on an approximately 200 mm long supporting structure in vacuum. Although the aluminum cavity mount body should provide sufficient heat conductivity to limit the temperature increase to 10 K, it was planned to actively control the temperature of the cavity with a thermoelectric cooler, to avoid the fluctuations in the cavity alignment driven by the temperature fluctuations. It was planned to use a TE Technology thermoelectric set (cold plate and controller), capable of absorbing up to 28 W and able to maintain the temperature well within 0.1 K of the set point.

To facilitate the heat conduction outside, it was planned to use up to three copper/water heat pipes running within grooves along the supporting structure, with a diameter of 4-6 mm. Such heat pipes, commonly used for chip cooling in the electronics industry, have a thermal resistance well below 0.1 K/W, providing a greatly increased heat-removing capability compared to a whole copper or aluminum rod suspension, without introducing vibration associated with circulating liquid coolers. At the same time, copper/water heat pipes are both vacuum compatible and non-magnetic, and thus suitable for use in a TEM environment.

Testing is described below. The following tests were planned to be performed in an optical bench setup to confirm that the phase plate prototype meets its target specifications:

The numerical aperture of the cavity mode will be measured by recording the far-field image of the beam transmitted through the cavity and fitting it with a Gaussian profile. The inferred mode waist will be $w_0=7$ μm or smaller.

The circulating optical power in the cavity will be at least 75 kW. The power will be calculated from the measured transmission coefficient of the output cavity mirror and the measured transmitted power with a calibrated power meter.

The system will operate in a vacuum chamber, with the pressure not exceeding $2.10^{-7}$ mbar, measured using a vacuum gauge.

The system will be able to continuously maintain the circulating power and numerical aperture without manual adjustment of any degrees of freedom for at least two hours, and it will be able to maintain those parameters for at least 10 hours with occasional adjustment of the controls.

The electron microscope, in one embodiment, is a low-base FEI Titan TEM, equipped with a side-entry Gatan cold holder, enabling studies of cryo-EM specimens. The images will be recorded with a 16 megapixel Gatan K2 Summit direct detection camera. As mentioned previously, the microscope has additional relay optics that magnifies the electron diffraction pattern, increasing the effective focal length to 20 mm. The microscope has four ports (three of them have a Ø25 mm acceptance) at the level of the conjugate back focal plate, providing convenient access to the diffraction plane 104. One of the ports will be used to insert the cavity module, and the transmitted laser beam will be directed into a nearly diametrically opposed port (170° offset) with a prism attached to the cavity mount.

The insertable laser module will be made of non-magnetic materials to avoid disturbing the magnetic field of the TEM electron optics: aluminum alloy (cavity suspension system), piezo ceramics, fused silica (mirrors, lenses). The small micrometer screws that were planned to use are made of type 316 stainless steel, with silicon carbide ball-tips. In case the extremely weak magnetic permittivity of the stainless steel will be found to disturb the TEM alignment, titanium screws can be used as a fallback option.

The laser beam source and the frequency locking system will be placed adjacent to the electron microscope. The light will be brought to the insertable module using a flexible, high-power polarization-maintaining single mode fiber. One advantage of the fiber coupling is that the alignment of the optical system to the electron beam can be conducted by moving the whole optical insertable module without disturbing its internal alignment.

The insertable module will be suspended in a mount that permits three-axis position adjustment of the module with respect to the TEM column. The laser focus, and thus the module, needs to be vertically positioned to within 100 μm of the diffraction plane 104. This ensures that the transmitted electron wave crosses the high intensity area when it is focused to a size smaller than the fringe of the laser wave. The horizontal position in the direction orthogonal to the cavity optical axis needs to be controlled to within 1 μm. This ensures that any misalignment is much smaller than the waist of the laser beam. Finally, the horizontal position along the cavity axis needs to be stable to better than 100 nm. This ensures that the unscattered electron beam passes through a maximum of the standing wave, since the half-maximum width of the standing wave fringes is just 266 nm. On the other hand, all maxima within a ~50 μm range around the beam waist have approximately the same intensity (as shown in FIG. 5) and any of these can be used to retard the transmitted wave. A piezo actuator will be incorporated in the suspension system to keep the longitudinal position of the cavity stable.

To position the cavity focus in the center of the conjugate Fourier plane, it was planned to follow a two-stage procedure. First, for rough alignment, it was planned to use the Ø1 mm circular openings cut out in the cavity mount to let through the electron beam (the "beam holes") to center the cavity focus under the electron beam with no specimen inserted. This position can be found by moving the assembly while observing the TEM image, noting the points where the electron beam is blocked by the edge of the beam holes. Then, for a finer alignment, an amorphous carbon film can be used as specimen. Observing the Fourier transform of the image at an appropriate defocusing reveals the position of the laser focus relative to the center of the TEM Fourier plane. Using the image as guidance, the center of the cigar-shaped focus can be brought into the center of the Fourier plane.

For the fine adjustment of the module position along the cavity axis, it was planned to again use the defocused image of amorphous carbon to observe the Thon rings. When the unscattered beam passes through the node of the standing wave, the Thon rings should have their usual pattern. However, when the unscattered electron beam is phase-shifted by the standing wave, the rings will shift by the same phase, providing a quantitative feedback for the fine alignment.

Once the system is aligned, the power of the laser system can be calibrated by observing the shift of the Thon rings with varying laser power.

The delicate alignment of the near-concentric resonator is easily disturbed by vibrations and thermal expansion. On the optical bench, the alignment can be restored manually by via piezo actuators. To be useful to the TEM user community, however, the phase plate needs to be able to operate without frequent human intervention.

One goal was to overcome this difficulty by automating the slight adjustments needed to keep the cavity aligned. As verified in previous work, the leading types of misalignment are readily observed using a CCD camera monitoring the laser beam transmitted through the cavity, and the necessary adjustments are straightforward. When the cavity 110 is nearly perfectly aligned, there are three principal modes of misalignment: (i) pitch and (ii) yaw tilts of the mode relative to the cavity axis, and (iii) a change in the numerical aperture of the mode. These three modes can be measured by observing the output laser beam with a camera and fitting its intensity profile with a Gaussian for the two coordinates of the centroid and the beam width. The coordinates of the beam center will be used to adjust the mirror tilt, realigning the mode with the cavity axis, and the size of the mode will be used to stabilize the cavity length (and thus the mode waist). For these purposes, piezo actuators were incorporated into the mirror mount. The bandwidth of this feedback system does not need to be high, as in the optical bench adjustment was only needed once in every several hours of operation. Given that vibration isolation of the TEM system is at least as good as that of an optical table, it was expected the adjustment would not need to be more frequent, so standard computer interfacing tools would be more than sufficient to provide the necessary bandwidth.

It was considered possible that the alignment of the unscattered electron beam to a maximum of the standing laser wave would need to be checked periodically by monitoring the Thon ring pattern of the observed images. One embodiment to implement this feature is as a software plug-in that analyses the TEM images and sends a feedback signal to the actuator controlling the alignment of the phase plate module to the electron beam.

It is in principle possible to use the laser phase plate either in the back focal plane, or any suitable conjugate plane on the column of the TEM.

Higher numerical apertures require highly curved mirrors beyond the reach of the polishing processes currently used for high-finesse mirrors, such as the ones planned for use in various embodiments. An advanced process, ion beam milling, however, is in principle capable of doing so. A numerical aperture as high as 0.36, corresponding to a mode waist of $w_0=0.94$ μm (at $\lambda=1064$ nm) has been reported in a near-concentric cavity. A cavity-based ponderomotive phase plate with focus as tight as this would enable phase contrast imaging in regular TEM with a focal distance of f=2.5 mm.

Ion beam milling, however, creates a surface that is not sufficiently smooth for a low-loss mirror, and must be super-polished before a reflective coating can be applied (one cavity reported had a finesse of only about 600). It may not have been clear at one time whether it would be possible to polish very high-NA ion-milled substrates to a surface roughness sufficiently small for manufacturing of high finesse cavity mirrors. Furthermore, even if the substrates were sufficiently smooth, it was not certain at the time of planning that the highly reflective dielectric coating could be applied with sufficient uniformity to a mirror of such a high numerical aperture.

If the straightforward approach of increasing the numerical aperture did not succeed, another embodiment was to use a compact assembly including two or more crossed cavities. One possible approach was to use a three-cavity configuration to create an interference pattern featuring narrow intensity peaks.

Figure 8:
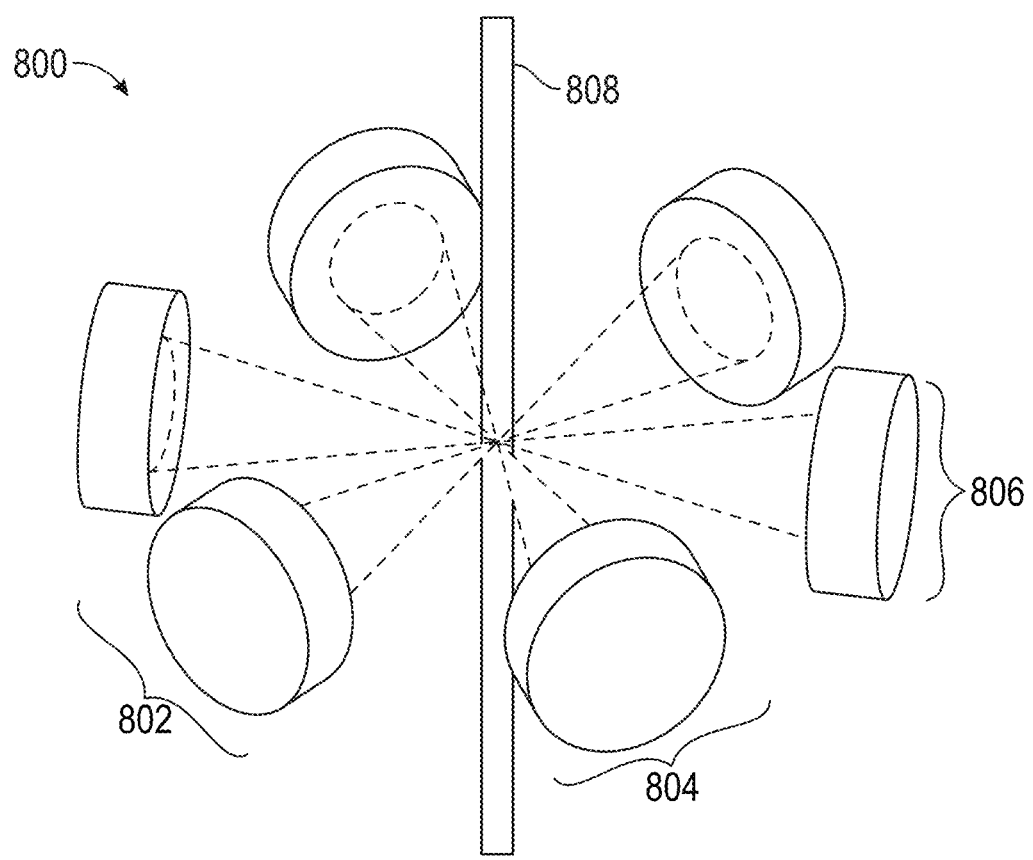
FIG. 8 is a perspective view of a laser phase plate composed of three cavities with overlapping focal volumes, in one embodiment.

FIG. 8 is a perspective view of a laser phase plate 800 composed of three cavities 802, 804, 806 with overlapping focal volumes. The electron beam 808 is shown as a vertical line. The cavities 802, 804, 806 were planned to be arranged in the horizontal plane with their axes at 60° to one another, and their focal volumes intersecting, as shown in FIG. 8. The numerical aperture of each cavity 802, 804, 806 can be moderate. Because of constructive interference between them, each cavity 802, 804, 806 only needs to have ⅑th of the laser power that is needed to create the same phase shift with a single cavity.

The three cavities 802, 804, 806 were planned to be frequency-locked to a single feeding laser using the Pound-Drever-Hall method, ensuring the mutual coherence of the intra-cavity fields.

Figure 9A:
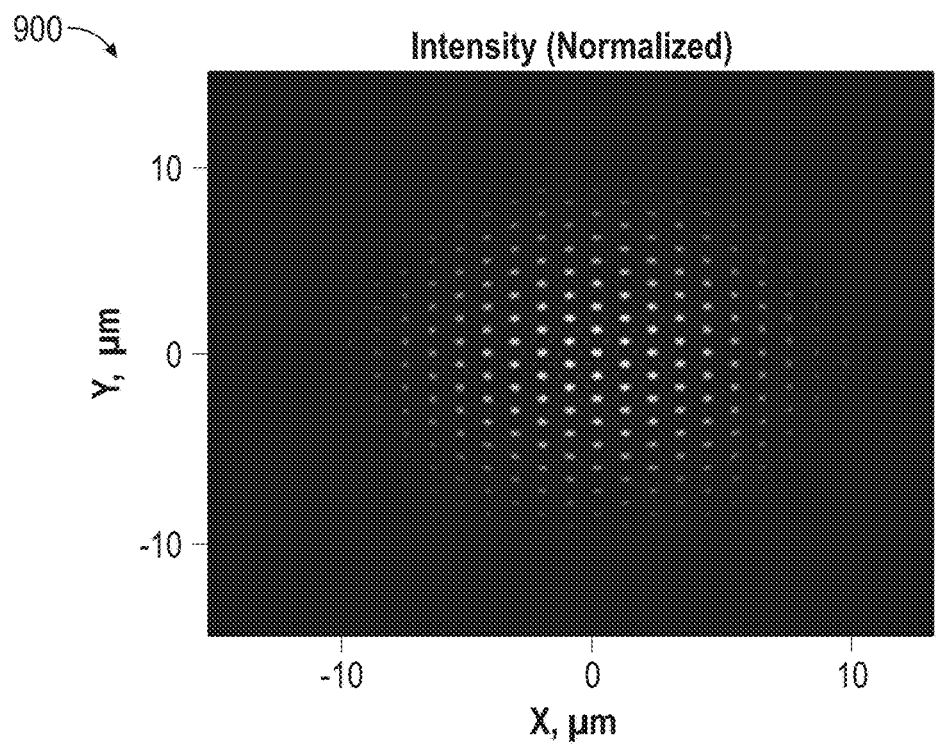
FIG. 9A depicts the interference pattern produced by the three-cavity arrangement, featuring a hexagonal lattice of interference peaks.

FIG. 9A depicts the interference pattern 900 produced by the three-cavity arrangement, featuring a hexagonal lattice of interference peaks. The interference pattern of the three cavity modes forms a hexagonal lattice of narrow intensity peaks, with a half-maximum diameter of 382 nm (see FIG. 9A). The transmitted electron wave will be aligned to pass through the central, highest-intensity peak. Although the additional high-intensity peaks create 'blind zones' in the diffraction plane 104, where the contrast transfer function is close to zero, such zones are small and isolated. The rotationally averaged CTF for this configuration, assuming a focal distance f=2.5 mm, is shown in FIG. 9B.

Figure 9B:
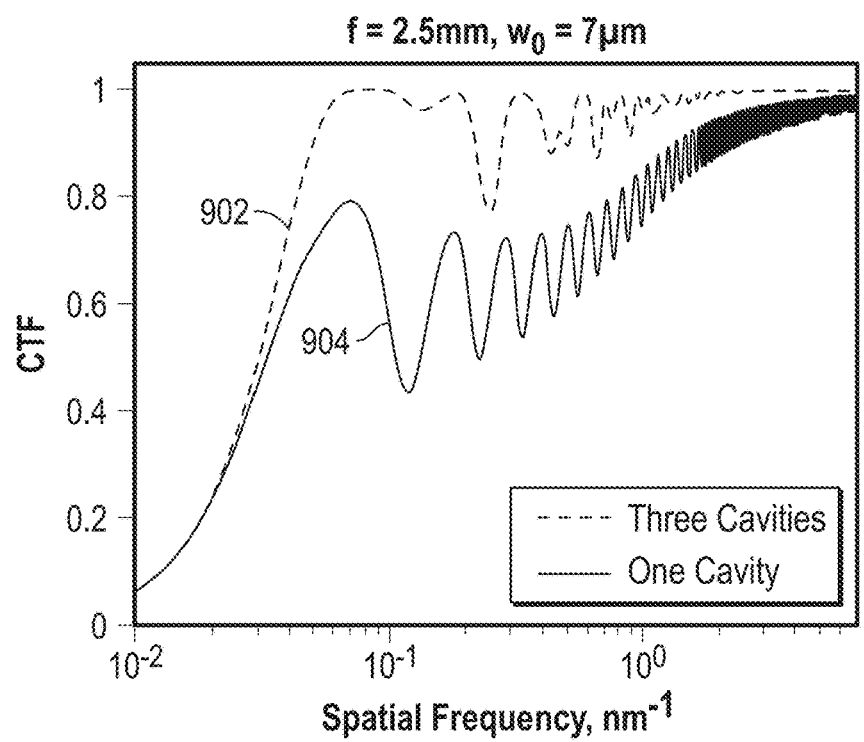
FIG. 9B depicts the rotationally averaged contrast transfer function of a three-cavity phase plate (upper curve) compared with a single-cavity (black) for f=2.5 mm (lower curve).

FIG. 9B depicts the rotationally averaged contrast transfer function of a three-cavity phase plate (upper curve 902) compared with a single-cavity (black) for f=2.5 mm (lower curve 904). Due to the narrow central peak, the CTF reaches 90% of the maximum already at a spatial frequency of about $v=(20$ nm$)-1$, and stays close to unity at higher frequencies, with moderate dips due to additional intensity peaks. The three-cavity configuration should thus enable full-contrast observation of particles up to about 10 nm in diameter, which is sufficient for most particles with a molecular mass of 200 kDa or less.

The cavities 802, 804, 806 can be positioned relatively to the electron beam (and thus to one another) by turning off all but one cavity, and translating it longitudinally until the phase shift of the transmitted wave (observed by Thon ring shift) is maximized, and repeating this procedure for all cavities.

The following describes reaching a milestone towards a prototype laser phase plate, and achieving continuous 40 GW/cm² laser intensity in a near-concentric optical cavity.

Manipulating free-space electron wave functions with laser fields can bring about new electron-optical elements for transmission electron microscopy. In particular, a Zernike phase plate would enable high-contrast imaging of soft matter, leading to new opportunities in structural biology and materials science. A Zernike plate can be implemented using a tight, intense continuous laser focus that shifts the phase of the electron wave by the ponderomotive potential. Here, a near-concentric cavity was used to focus 7.5 kW of circulating laser power at 1064 nm into a 7 μm waist, setting a record for continuous wave laser intensity and establishing a pathway to ponderomotive phase contrast TEM.

Transmission electron microscopy (TEM) has emerged as a crucial source of structural information with atomic resolution, both in molecular biology and materials science. One limitation of TEM is that specimens consisting of light elements, such as biological macromolecules, are nearly transparent to the electron beam, leading to weak image contrast. In optical microscopy, the problem of observing thin transparent objects, such as living cells, was solved by the invention of phase contrast microscopy by Zernike. Introducing Zernike-type phase contrast to electron microscopy has been a goal of an increasingly intense research effort. Recently, phase contrast in TEM has been spectacularly demonstrated with carbon foil-based phase plates. Nevertheless, there is still significant potential for improvement: exposure to the electron beam changes the properties of the carbon foil over time, varying the contrast transfer function and limiting the time a phase plate can be optimally used for imaging.

Controlling free-space electron propagation with lasers offers an alternative approach to electron optics. A charged particle traversing an intense laser field experiences small-scale oscillatory motion, resulting in an effective "ponderomotive" potential. Experiments with electron scattering on a standing laser wave have shown that the ponderomotive potential can be used to create a diffraction grating and a beam splitter for electron beams. It has been proposed recently that a laser beam focused in the back focal plane of a TEM objective lens can serve as a Zernike phase plate. Unlike material phase plates, a laser phase plate is inherently immune to charging and electron beam damage, and offers negligible electron loss. The possibility of rapidly changing the phase delay by varying the laser power is an additional advantage.

Free-space manipulation of energetic electrons used in TEM requires very high laser intensity. The phase delay induced by a focused Gaussian laser beam can be calculated as $$\varphi = \sqrt{8\pi} \frac{\alpha}{\beta\gamma} \frac{P}{mc\omega^2 w} \quad (5)$$

where $\alpha$ is the fine structure constant, c is the speed of light, m is the electron mass, $\beta$ and $\gamma$ are the electron's relativistic factors, P is the beam power, $\omega$ is the laser angular frequency, and w is the beam waist (see also Eq. 2). Another possible requirement for a ponderomotive phase plate is that the focal spot size should not exceed a few micrometers. According to eq. (5), imparting a $\pi/2$ phase shift to electrons at a typical TEM energy of 200-300 keV over a distance of several microns necessitates a laser intensity in the range of a few hundred GW/cm2. Consequently, most experiments with electron scattering on light have been conducted with pulsed laser systems. However, continuous operation is desirable for cryo-EM and other high resolution TEM applications where the signal to noise ratio is the limiting factor.

The laser power of a continuous-wave (CW) system can be enhanced using a power build-up cavity. Low-loss cavity mirrors have been shown to withstand intensities up to 0.1 GW/cm2. Much higher intensities required for a ponderomotive phase plate can be achieved in a focusing cavity, such as a near-concentric Fabry-Pérot resonator. In this configuration, the fundamental mode has an hourglass shape, with laser power concentrated in a small focal spot at the center but spread out over a large area on the mirror surface, which prevents mirror damage. Tight intra-cavity focusing at low power has been demonstrated in a medium-finesse near-concentric cavity. At the same time, average circulating power of up to 670 kW has been achieved in a focusing cavity built for amplifying trains of ultrashort pulses for infra-cavity high harmonic generation and optical comb spectroscopy in the extreme ultra-violet spectral range. However, a combination of high power and tight intra cavity focusing necessary for a laser phase plate has not been realized yet.

Here, it is reported reaching a milestone towards a prototype laser phase plate, implemented as a high finesse, high numerical aperture near-concentric cavity. Its fundamental mode is characterized, and a numerical model is used to analyze properties of TEM in the presence of the intra-cavity laser field. With 7.5 kW of circulating CW laser power, a maximum intensity of 41 GW/cm2 is demonstrated, previously achieved only in pulsed laser systems, which is sufficient to retard a 300 keV electron beam by 0.16 rad.

Experimental results are reported below. The optical system, shown schematically in FIG. 5, includes a near-concentric cavity 110 and a CW feeding laser 522, operating at a wavelength $\gamma$=1064 nm. The feeding laser 522 in this embodiment is an external cavity diode laser, frequency-locked to the cavity using the Pound-Drever-Hall method, and a fiber amplifier 502. The cavity 110 is designed for insertion into a plane conjugate to the back focal plane of a TEM objective lens, with the electron beam entering the cavity orthogonally to the optical axis. The cavity is formed by two concave mirrors 512 (Layertec) with a diameter of 12.7 mm, radius of curvature of 12.7 mm, and specified reflectivity $R=1-(10\pm5)\cdot10^{-5}$. The back surface of the mirrors is convex, concentric with the front surface. The meniscus shape allows for efficient coupling into the high numerical-aperture mode of the cavity with a single aspheric lens 510.

The cavity mount (see FIGS. 6 and 7) allows for adjustment of the tilt and axial position of one of the mirrors 604, housed in a flexure suspension. The entire cavity housing 606 is machined from a single block of aluminum, to ensure precise centering of the mirrors 604 and to provide effective thermal conduction to cool the cavity. Alignment of the near-concentric cavity 110, requiring angular precision better than 1 μrad, is achieved by three fine-pitched micrometer screws providing rough alignment, pressing against three piezo actuators positioned in the pockets of the aluminum block. The high-power optical module comprising the cavity 110, the coupling lenses 602 and the mirror alignment optomechanics, is made compact enough to fit into a cylindrical space of 25 mm diameter, which facilitates future integration into a TEM system.

The cavity 110 is suspended in a vacuum chamber pumped down to $2\cdot10^{-7}$ mbar, emulating the environment of an existing TEM column and preventing undesirable ionization of air molecules. Using the tilt and axial motion degrees of freedom of one of the mirrors, the cavity 110 was brought to a near-concentric configuration. To characterize the size of the focal point inside the cavity, the laser frequency was tuned to oscillate around the fundamental mode of the cavity 110. The transmitted beam was collimated by an aspheric lens (focal length 25 mm) and directed into a CMOS image sensor. Fitting the mode image with a two-dimensional Gaussian profile, the width of the fundamental mode at the far field was obtained, reciprocal to the size of the focal spot. The image exhibits a small degree of ellipticity determined by a very slight astigmatism of the cavity mirrors. The two principal axes of the ellipse correspond to numerical apertures of $NA_a=0.0469\pm0.0005$ and $NA_b=0.0524\pm0.0005$. The mode waist corresponding to $NA_b$ is $s=\lambda(\pi NA)^{-1}=6.46$ μm.

The reflectivity of the cavity mirrors 114, 116 was measured using the cavity ring-down (CRD) method, in which light is briefly injected into the optical cavity 110 and the subsequent rise and decay in the power of the transmitted light is observed. To avoid the need for a pulsed laser source or optical modulators, injection of light into the optical cavity 110 was accomplished by rapidly sweeping the laser frequency across a longitudinal mode resonance of the cavity's $TEM_{00}$ mode (rapidly-swept cw-CRD).

Under these conditions, the transmitted electric field amplitude is well-modeled by the inverse Fourier transform of the product of the cavity's transfer function and the spectrum of a linearly-chirped laser field, so that the transmitted power is $$P(t) \alpha \left| \int_{-\infty}^{\infty} d\omega e^{i\omega t} \cdot \left[ \frac{e^{-\frac{i\omega L}{c}}}{1 - Re^{-\frac{2i\omega L}{c}}} \right] \cdot \left[ e^{-\frac{i\omega^2}{2\eta}} \right] \right|^2 \quad (6)$$

where R is the cavity mirror reflectance, L is the cavity length, and η is the frequency sweep rate. This model was used to fit the experimentally measured CRD profiles, with R, serving as the fit parameter of interest.

The measured CRD profile is shown in FIG. 4 along with its least-squares best fit to the model described by Eq. (6). Expressing the cavity mirror reflectivity in terms of the cavity mirror transmission, T, and loss, L, such that R, $=1-(T+L)$, the fitted profile corresponds to a cavity mirror transmission-plus-loss of $137.9\pm0.4$ ppm. This corresponds to a cavity finesse of $$\mathcal{F} = \frac{\pi R}{1-R} \approx \frac{\pi}{T+L} = 22780 \pm 65.$$

The seed laser was locked to the cavity using the Pound-Drever-Hall method, with side bands generated by direct RF modulation (e.g., by RF generator 1216, see FIG. 12) of the seed laser current. The reflected beam was separated by a Faraday isolator 508 and directed into a photodiode 506. The RF signal from the diode was demodulated and used as the error signal.

To estimate the circulating power in the cavity, in addition to cavity finesse the coupling efficiency and the transmission-to-loss ratio of the mirrors are needed. Both parameters can be inferred from measurements of the cavity transmission coefficient $T_{cav}$ and reflection co-efficient $R_{cav}$. Denoting the mode overlap between the input beam and the fundamental cavity mode as Q, it is derived:

$$T_{cav} = |Q|^2 \left(\frac{T}{T+L}\right)^2, \quad R_{cav} = 1 - 2|Q|^2 \frac{T}{T+L} + T_{cav} \quad (7)$$

With the laser frequency locked to the cavity resonance, measurement was made of $R_{cav}=0.34\pm0.03$, $T_{cav}=0.32\pm0.03$. Extracting the cavity parameters results in $|Q|^2=0.75\pm0.05$ and $T/(T+L)=0.65\pm0.05$. Taken together with the CRD data, these parameters allowed determining the mirror transmission $T=90\pm7$ ppm and the amplification factor as $$M = |Q|^2 \frac{T}{(T+L)^2} = (T_{cav} + 1 - R_{cav})/(2(T+L)) = 3600 \pm 150.$$

With the cavity parameters determined, input power was increased. With the cavity chamber held at atmospheric pressure, increasing the input power beyond 300 mW did not lead to further increase in transmitted power, apparently due to the onset of nonlinear optical effects in air at a circulating power of about 1 kW, corresponding to a maximum intensity of 5.5 $GW/cm^2$. With the chamber evacuated, intracavity power of up to $7.5\pm0.6$ kW was reached. The intra-cavity circulating power 204 (inferred from transmitted power) as a function of input power 202 is shown in FIG. 2. The graph is almost linear, with a small deviation at higher power possibly arising due to thermally induced deformations of the cavity housing modifying the cavity alignment. The maximum power was limited by the concern over the risk of thermal damage to the mirrors, which were not well thermally coupled to the mount. With the mode parameters measured above, the maximum measured power corresponds to a maximum intensity of $(41\pm4)$ $GW/cm^2$, which would lead to a phase retardation of 0.16 rad for a 300 kV electron beam. Repeated CRD measurements at low power confirmed that no damage to the mirrors occurred during the high power run.

Numerical modeling is described below. To evaluate the effect of the laser phase plate on TEM of biological macromolecules, conducted numerical simulations of TEM imaging of human hemoglobin embedded in vitreous ice were simulated. This tetrameric complex has a molecular mass of approximately 64 kDa, which is too small for conventional TEM reconstruction, but has been recently solved to 3.2 Å resolution using phase contrast TEM with a carbon foil phase plate.

Modeling of TEM images (not shown) of a hemoglobin molecule with a cavity-based ponderomotive phase plate were examined and showed (a) a ribbon diagram of the molecule, (b) a two-dimensional projection of the atomic potential, (c) the phase shift caused by the fundamental mode of the optical cavity. The magnified image showed individual fringes of the standing wave. Panel (d) showed a simulated TEM image, without the shot noise, of the molecule in the same orientation as in (a,b), with a shifted 'ghost' image corresponding to the first diffraction order. A simulated conventional TEM image, underfocused by 1 pm, at a dose of 20e/Å was produced. An in-focus image was shown as formed with a cavity-based ponderomotive phase plate at the same electron dose. The cavity numerical aperture in the model is NA=0.05, in agreement with the experimentally demonstrated parameters. The model assumes that the intra-cavity power is scaled to achieve full 2 retardation at maximum, which requires a roughly tenfold further increase of optical power.

Multislice simulations were performed. An accelerating voltage of 300 kV, a pixel size of 0.2 Å and spherical aberration of 1.3 mm was used. Because shot noise and thermal smearing of the potentials dominated the information limit of the simulations, the finite spatial and temporal coherence of the electron beam were neglected in the simulations. The hemoglobin structure used was downloaded from the protein databank. The thermal vibration of the protein atoms was assumed to be 0.1 Å, applied as an envelope function. The continuum model of vitreous ice developed by Shang and Sigworth was used to model the embedding potential around the hemoglobin structure, numerically integrated in 3D.

The results of the modeling were studied. The spatial map of the phase shift induced by the Gaussian standing wave cavity mode is shown in FIG. 3, with a zoom-in plot (see inset 304) showing the individual minima and maxima of the standing wave.

A side effect of passing an electron beam through a standing laser wave is that the standing wave acts as a diffraction grating for the electrons, which generates additional weak "ghost" images. These ghost images are displaced from the primary image by a distance $\delta x = 2nf\lambda_e/\lambda$, where n is the diffraction order, f is the focal distance of the TEM objective and $\lambda_e$ is the electron wavelength. A first order ghost image (not shown) rendered without shot noise is visible, but would be invisible with the shot noise. Since the amplitude of such ghost images is well below shot noise, they will not be visible in individual images, and will amount to an inconsequential contribution to the noise in the averaged images used for density map reconstruction.

A simulated TEM image of the hemoglobin molecule (not shown) was studied. Highly transparent biological macromolecules are conventionally made visible by defocusing the imaging system from the specimen plane 102 (see FIG. 1), creating a phase contrast image with an oscillatory contrast transfer function. While a higher defocus results in higher contrast at low spatial frequencies, it also leads to a loss of contrast at high spatial frequencies. The defocus of 1 μm used here is a value that still allows for reconstruction of density maps with near-atomic resolution. The shot noise is modeled assuming an effective dose of $20e/Å^2$, typically used in TEM protein structure studies as an optimum point between radiation damage, which increases with the dose, and the shot noise decreasing with it. An in-focus image (not shown) of hemoglobin with the ponderomotive phase plate at the same electron dose was studied. A full π/2 phase shift at the intensity maximum is assumed. The phase contrast image demonstrates a stronger signal at low spatial frequencies compared to a defocus-contrast image, which is expected to enable particle projection classification and alignment for macromolecules at least as small as hemoglobin.

The numerical results studied with reference to FIG. 3 demonstrate that a standing wave built up in a focusing resonator creates a contrast transfer function suitable for phase contrast imaging. Importantly, the well-defined spatial structure of the cavity mode ensures that the contrast transfer function can be accurately taken into account when interpreting the EM images. While the intensity demonstrated in the experiment is about an order of magnitude below that required to impart an/2 phase shift to a 300 keV electron beam, it may be sufficient for the initial demonstration of the ponderomotive retardation. Furthermore, using state of the art mirrors it should be possible to increase the cavity finesse to $2.10^5$. Increasing the input power to 30 W, which is possible with commercial fiber amplifiers at NIR wavelength, should be sufficient to increase the focal intensity to well beyond $10^{12}$ W/cm2.

In this work, one embodiment developed is a laser-based Zernike phase plate. However, a number of other tools can be envisioned using high-intensity infra-cavity CW laser fields. For example, a quantum imaging method based on an interaction-free measurement scheme has been proposed. A significant obstacle to implementing this scheme lies in the absence of a high quality beam splitter for the electron wave function. A CW standing wave inside an optical cavity can act as a highly regular, virtually lossless phase grating, coherently splitting an electron beam into two paths via Kapitza-Dirac scattering in the Bragg regime. Such a beam splitter could also enable various electron interferometry schemes, mimicking the diverse family of optical interferometers used for metrology and sensing.

Finally, it is noted that the type of cavity that has been built can be of interest to a wide class of experiments. The combination of a small mode volume with the open, accessible geometry of a high-NA near-concentric resonator can be useful for cavity QED experiments. Furthermore, the ability to build up very high circulating power can be used to implement ultra-deep dipole traps, as well as for trapping and cooling nanoparticles.

In summary, a high-finesse optical cavity 110 with a tightly focused fundamental mode has been developed. By numeric simulations, it has been verified that such field configuration can function as a ponderomotive phase plate for TEM. It has been demonstrated that optical intensity in the range of tens of GW/cm2 can be reached in a CW laser system using a near-concentric Fabry-Pérot resonator. These results represent a significant step towards ponderomotive phase contrast TEM, and, more generally, pave the way towards laser based coherent control of free space electron wave functions.

Research results and embodiments of a transmission electron microscope 1002 with an optical-cavity phase plate are described below.

FIG. 10 shows one embodiment of a transmission electron microscope 1002 including an optical-cavity phase plate according to an embodiment of the disclosure. Electron gun 1024 produces an electron beam 1012 which is collimated by the condenser 1020, focused by the specimen objective lens 1018, passed through a specimen at the specimen plane 102 (see FIG. 1), passed through the Fourier transform plane 1004 in the laser cavity 1008, and focused by the projection lens 1022 to produce an image 1016.

In an embodiment, a strong electric field in a tightly focused laser beam forms a phase plate (see FIG. 10). The phase plate, inserted into the Fourier transform plane 1004 (i.e., the back focal plane or diffraction plane 104 in FIG. 1) of the electron microscope 1002, consists of an intense focused laser beam 1014 from a laser 1006.

A nearly spherical resonant optical cavity, laser cavity 1008, is used to shape the focus and to further enhance the laser beam phase plate intensity. The electron beam 1012 travels through holes at opposite ends of the spherical optical cavity housing 1010 (e.g., on top and bottom). The interaction of the laser beam's intense electric field with the charge of the electrons creates a phase-shift in the electron beam, which corresponds to an increase of an "optical path length" of the electrons, which may be visualized as wiggling the electron trajectory to increase the path distance traveled. If the increase is ¼ of the electrons' de Broglie wavelength, the desired π/2 phase shift is achieved.

Figure 11:
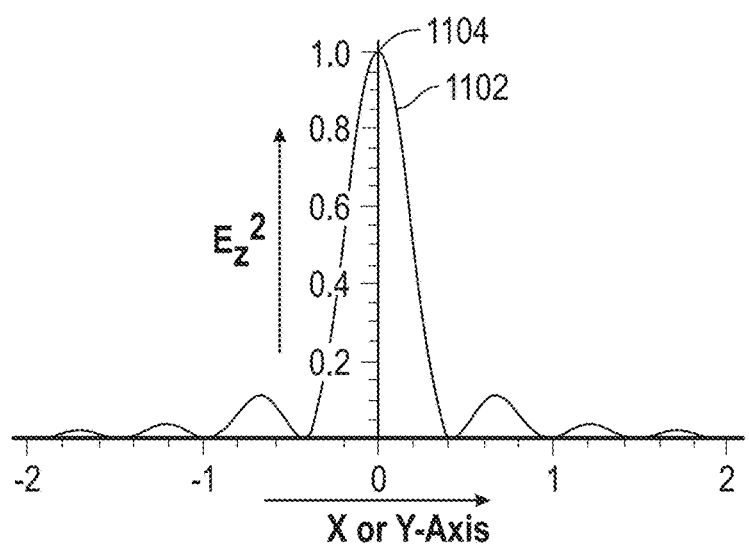
FIG. 11 shows an intensity pattern of a resonant optical-cavity phase plate according to an embodiment of the disclosure.

FIG. 11 shows an intensity pattern 1102 of a resonant optical-cavity phase plate according to an embodiment of the disclosure. Resonant enhancement of the laser beam in the spherical optical cavity housing 1010 alleviates the high power optical beam requirements. This provides a narrow intensity maximum 1104 at the center (about 0.5 wavelengths radius, as shown in FIG. 11), which is a good match to the size of the undiffracted electron beam in the Fourier transform plane. Electrons outside the center see a comparatively low electric field and experience negligible phase shift.

In a simple classical model, the laser's action as a phase plate is because the alternating electric field of the laser wiggles the trajectories of the electrons and thus increases their path length. A quantum mechanical treatment shows that the phase shift is $$\delta = \frac{\hbar\alpha\rho\lambda\tau}{m}, \quad (8)$$

Here, h is the reduced Planck constant, α the fine structure constant, ρ the density of photons, λ the laser wavelength, τ the time it takes the electrons to traverse the focus, and m the electron mass. Away from the optical focal point at the center of the cavity the photon density ρ drops rapidly, so that there is no significant phase shift other than at the optical focus. The photon density can be expressed as $\rho=4P/(\pi^2 c^2 \lambda \hbar)$ by the laser power P, where c is the velocity of light. It is assumed that the electric field has a Gaussian intensity profile with an $1/e^2$ intensity "waist" radius of $w_0 = \lambda/2$, which is a good approximation for the intensity distribution inside the cavity. This is the smallest focus that can be obtained for a laser of given wavelength; a larger focus is possible but results in higher required laser power. For estimating the transit time τ, the same model is used to obtain $\tau = \lambda/v_e$, where $v_e$ is the electron beam velocity. A more accurate estimate, which takes into account the actual intensity distribution of the cavity (FIG. 11), is $\tau = \mathrm{sqrt}(\pi/2) \lambda/v_e$. Inserting into Eq. (1), the phase is $$\delta = \sqrt{\frac{8}{\pi^3}} \frac{\alpha\lambda P}{m v_e c^2}, \quad (9)$$

The laser phase plate has the property that almost no electrons are lost when traversing the phase plate: Only about one electron in a million will be lost by Compton scattering with the photons.

Equation (9) can be used to calculate the laser power P required to generate a $\delta = \pi/2$ phase shift as a function of electron velocity and laser wavelength. The electron velocity $v_e$ for a 100 keV electron microscope is approximately $10^8$ m/s.

According to Eq. (9), the desired π/2 phase shift is dependent on the product of laser wavelength and laser beam power. It is desirable to work with the lowest possible laser power P, which can be traded off with a larger laser wavelength λ.

Conversely, the laser wavelength determines the size of the laser focus, which has to match the size of the undiffracted electron beam. In particular, if the focus is too large, a loss of contrast for larger structures in the specimen results. For example consider the tobacco mosaic virus, which is rod-shaped with a diameter of d=18 nm. Obtaining the full amount of contrast over this diameter requires phase contrast for spatial frequencies up to 1/(2d)=1/(36 nm). For example, the electron optical focal length in the an electron microscope (e.g., FEI Titan, available from FEI Company, 5350 NE Dawson Creek Drive, Hillsboro, Oreg. 97124) is f=20 mm and the electron wavelength $\lambda_e$ is 3.7 pico meters (pm) at 100 keV. Resolving spatial frequencies of 1/(36 nm) will lead to a maximum phase plate radius on the order off $\lambda_e/(2d)=20$ mm×36 nm/(3.7 pm)≈2 μm, i.e., a maximum wavelength of approximately 4 μm.

High-power lasers at this wavelength are hard to obtain. Selection of a laser wavelength is also constrained by the availability of reliable commercial high-power lasers. For example, according to Eq. (9) a laser wavelength of 1064 nm requires about 5 kW of laser power to generate the required π/2 phase shift for a 100 keV electron beam. At this wavelength, a radius of the optical beam focus of about 0.5 μm is obtained. This would enable phase contrast for structures sized up to 80 nm, satisfying the above requirements.

Pulsed lasers can easily achieve kW-level power for durations of nanoseconds (ns), but their use would require pulsing the electron beam as well. Such pulsing, however, is not available in most commercial TEM devices. Most importantly, however, cathode current density limitations in the electron gun introduce new complications in the operation of an electron microscope in a pulsing mode. Therefore, a continuous wave high intensity optical field is desirable.

The intensity of the laser beam may be increased by use of an optical cavity to obtain resonant enhancement. In such a cavity, the laser radiation is bouncing back and forth between the cavity mirrors. If the laser wavelength is an half-integer multiple of the mirror separation, the radiation on all round-trips adds constructively, providing resonant intensity enhancement. This happens when the radiation has one of the resonance frequencies $$f_n = \frac{nc}{2L} \quad (10)$$

where n=1, 2, 3, . . . is a mode number (this equation holds to sufficient accuracy of the cavity when length L is much larger than the wavelength). For resonant laser light, the intensity will be increased by a factor of $$1/(1-R), \quad (11)$$

where R is the reflectivity of the mirror. A perfect reflector would have a value of R=1.

Besides intensity enhancement, the cavity has to provide a very tight focus of the laser beam. A tightly focused beam diverges quickly, i.e., requires optics with a large numerical aperture (NA). The smallest focus, therefore, results from the strongly divergent transverse electromagnetic mode TEMn01 in a spherical cavity that encloses the optical beam completely (see FIGS. 11 and 12). The electromagnetic field in a strongly focused beam is nontrivial. Use of this spherical cavity has the additional advantage that the electric field in such a spherical cavity is known from analytical calculations.

Referring to FIG. 10, the optical cavity 1008 may be arranged, for example, with the electron beam 1012 going vertically downwards (e.g., along a z-axis), entering the cavity 1008 through a hole at the top and exiting through another hole at the bottom. The laser beam 1014 is shown as pointing horizontally and may have its polarization orthogonal to the plane of the figure. The electric field far away from the center of the optical cavity is zero on a circle in the x-y plane that includes the top and bottom of the cavity. Thus, the holes for the electron beam will not lead to appreciable loss of optical power: These holes are large enough in order not to inhibit the flow of electrons, e.g., a radius of about 1 mm, but which may be larger or smaller. If the cavity radius is 10 mm or larger, these holes will dissipate no more than 0.01% of the cavity's circulating power. Moreover, this allows constructing the cavity out of two hollow hemispheres, joined after manufacturing to make a single sphere. They are joined in the plane of vanishing electric field, so that even an imperfect joint will lead to no appreciable loss of optical power.

The intensity enhancement factor is set by the reflectivity of the mirror surfaces, i.e., the high internal surface reflectance. With dielectric coatings, a reflectivity of R=99.99% and larger, corresponding to an intensity increase by factors of 10,000 and larger, is state of the art. Unfortunately, however, dielectric coatings require a precise thickness, which is difficult to achieve on highly curved surfaces such as the two hemispheres, but may eventually be achievable. Metal-coated mirrors are easier to fabricate, as the thickness of the coatings is unimportant. Metal reflectivity at 1 micron of 99% is conventionally available, providing power enhancement by a factor of 100. This may be sufficient with available state of the art high-power lasers.

In an embodiment, the required power can be reduced by increasing the wavelength, but this will increase the spot size. At a $CO_2$ laser wavelength of 10 μm, the power circulating in the cavity need only be 500 W for $\pi/2$ phase shift, and the power enhancement factor with metallic mirrors would be about 200. Thus, only 2.5 W of laser power would be required. With a ~5 μm size focal point, some loss in contrast for large scale features of the specimen would occur, as discussed above. Still, such a configuration would be simpler in terms of needed laser power.

The laser cavity 1008 may be made by joining two hemispheres with a radius of, for example, 8-10 mm to form the spherical optical cavity housing 1010. The size is primarily determined by the space that is available in the electron microscope for placement of the phase plate. The hemispheres may be ground into a quadratic shape in a block of beryllium-copper for good thermal conductivity and mechanical stability or, alternatively, Invar™ for low thermal expansion. It is noted that maintaining exactly spherical shape is of secondary importance, as the cavity may be deliberately distorted anyway, as described below. The hemispheres are polished to $\lambda/10$ and coated with gold on the inside. Because of the relatively high losses of the gold mirrors, a better polish is not necessary. The hemispheres may be attached to each other by one or more piezoelectric transducer (PZT) to tune the optical-cavity for frequency stabilization at one optical frequency, while suppressing other competing modes that may result in phase gratings of different standing wave period intensities. Laser power on the order of 50 W will dissipate on the cavity walls. The heat may be carried away by liquid cooling. For a temperature rise of 10 C (easily satisfied with liquid cooling) the 10-mm radius hemispheres expand by roughly 160 nm for BeCu or 16 nm for Invar™. This will lead to a shift in the resonance frequency which has to be compensated for by active feedback (described below). In addition to this, the dynamic range of the PZT must at least be half a laser wavelength to allow for obtaining resonance at any laser frequency (see Eq. (10)). A gold surface at $\lambda=1$ μm has R=0.99, achieving a power enhancement factor of 100. From Eqs. (9, 10) and assuming a 75% power transmission from the laser to the cavity, a 67 W laser would be required. A single frequency fiber laser currently available from IPG photonics (50 Old Webster Road, Oxford Mass. 01540) provides a 50 W laser at this wavelength. Since the phase contrast varies as the sine of the phase shift, and thus as the sine of the laser power, >90% of the optimum phase contrast is obtainable with a 50 W laser. A higher-power laser 1006 would enable working with a lower cavity coupling efficiency, lowering the cost of fabricating the optical cavity.

To efficiently couple the laser radiation into the cavity, it is desirable to obtain a nearly spherically symmetric mode from a directed laser beam. This is because besides the desired resonant mode with the tightest focus (see FIG. 11), the cavity can resonate in a large number of other modes due to the spherical symmetry. For an exact sphere, many of these modes have the same resonance frequency as the desired mode. Therefore, distorting the cavity slightly, which can be done simply by adjusting the distance between the half spheres, breaks the degeneracy of the cavity modes, i.e., the desired mode now has a distinct resonance frequency. If the laser radiation has this frequency, it will predominantly excite this mode. Other modes that would resonate at different frequencies are rendered cavity non-resonant and are thus suppressed.

Figure 12:
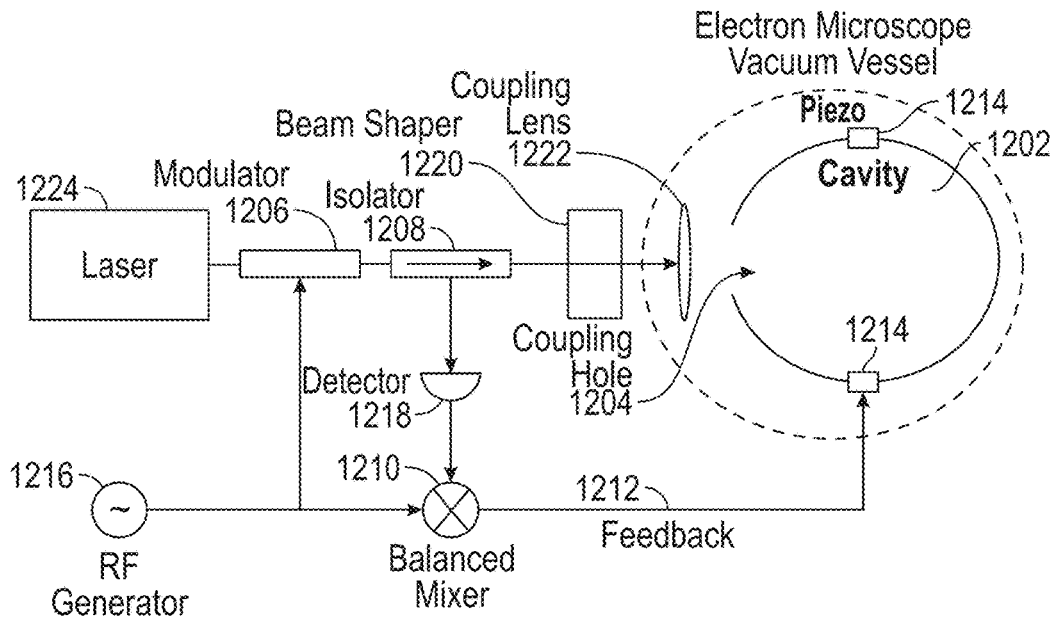
FIG. 12 shows a system for generating an optical-phase plate for modulating the phase of an electron beam according to an embodiment of the disclosure.

FIG. 12 shows a system for generating a an optical phase plate for modulating the phase of an electron beam. Coupling the laser beam can be achieved simply via a hole 1204 of radius $r_{in}$ in the cavity 1202. The transmission of power from the laser 1224 into the cavity mode is optimized when it balances the losses in the other parts of the cavity (i.e., losses due to finite reflectivity of the metal surfaces). For the desired resonant mode shown in FIG. 11, this condition is satisfied if $1=(\frac{2}{3})(4r_{cav}^2/r_m^2)(1-R)$, where $r_{cav}$ is the radius of the cavity 1202, and R the reflectivity of the cavity's mirror, or $r_{in}/r_{cav}=[8(1-R)/3]^{1/2}=0.16$ for R=0.99.

Even if this condition is satisfied, the coupling efficiency may still not be 100%. Consider a time-reversed situation where the cavity generates light, which exits through the coupler. The coupler is small compared to the size of the TEMn01 mode resonating inside the cavity. Thus, the electric field exiting through the coupler has a nearly uniform intensity over the diameter of the coupler and is nearly zero outside (neglecting diffraction at the edge, which is reasonable because the coupler's radius is much larger than the wavelength, therefore diffraction effects are substantially negligible). By time reversal, this defines the required shape of a laser beam impinging the cavity that has optimum power transfer. The laser, however, produces a Gaussian mode. The optimum power transfer between a Gaussian mode and the truncated ("top hat") cavity mode is 50.4% and occurs when the waist radius parameter of the Gaussian beam at the plane of the coupler is equal to the radius of the coupler. It also assumes a coupling lens of appropriate focal length. This efficiency can be improved to theoretically 100% by transforming the Gaussian beam into a uniform-intensity beam using a beam shaping apparatus, which is basically a phase grating. Such techniques with 84-90% efficiency have been reported.

In order for the cavity to provide maximum intensity enhancement, the laser's frequency must match one of the resonances of the cavity. To obtain resonance in spite of thermal and other drifts in the laser and cavity, a feedback mechanism based on the Pound-Drever-Hall method is used (e.g., as shown in FIG. 12). For this purpose, an electro optic modulator 1206 applies phase modulation with a frequency $\omega_m$ and a modulation index $\beta_m$ to the laser beam. The beam is coupled to the cavity through beam shaper 1220 and coupling lens 1222, and a reflected signal due to radiation exiting from the optical cavity is detected by a detector 1218. An isolator 1208 may be used to couple the reflected signal to the detector 1218. In another embodiment, beam splitters and mirrors may be used to couple the reflected signal to the detector 1218. The resonant properties of the cavity convert the phase modulation into amplitude modulation. When the laser and the resonance frequency coincide, the detected reflected component of the amplitude modulation (AM) reaches a minimum, ideally vanishing; otherwise, a nonzero AM occurs. It is detected by amplitude and phase using a double-balanced mixer (DBM) 1210, the output of which is lowpass filtered to suppress the modulation frequency $\omega_m$. This leads to a signal with a zero phase crossing at resonance. This signal is fed back, by feedback 1212, to the laser frequency actuator via a suitable servo 1214 that keeps the cavity resonance aligned to the laser 1224. Because of the high signal power in this system, a very slight modulation may be sufficient to obtain a feedback signal of high signal-to-noise ratio.

Numerous methods of use and applications may be considered. In biochemistry, major improvements may be realized in determining the structures of multiprotein complexes and macromolecular machines. In cell biology, major improvements may be realized in localizing such complexes and their spatial relationships within whole cells by EM tomography. In both cases, Zernike phase contrast is expected to improve the ability to image unstained specimens that are embedded in vitreous ice, i.e. in a life-like state.

In an embodiment, a method of use includes recording images 1016 of biological macromolecules and supramolecular structures. Such study requires obtaining the maximum image contrast that is physically possible. Compared with present defocus methods to image unstained samples in TEMs, the contrast of the in-focus Zernike optical cavity phase contrast microscope may be as much as a factor of ten greater (see above), and would not degrade or corrupt the signal at high resolution, as does the use of defocus.

In addition to the biological applications, in an embodiment, the microstructure of soft materials can be characterized.

In an embodiment, the optical cavity phase plate can be applied to generate a 3-dimensional optical trap of extreme depth. Trap depths can be in the range of tens or even hundreds of Kelvin, trapping, for example room-temperature atoms and localizing them in space to better than 0.5 microns, even for species for which cooling is difficult. Such traps are useful for a wide range of atoms or molecules, as the huge intensity in the cavity will make it unimportant to align the laser frequency closely to an atomic or molecular transition. This allows spectroscopy of very weak transitions for such atoms. An example is the nuclear spectroscopy of Thorium 229 atom with lasers. Laser spectroscopy of the ~5-6 eV transition in the Thorium 229 nucleus can be a breakthrough in precision measurements, as it allows for building "nuclear" clocks that are based on a transition between nuclear energy levels rather than those in the electron shells. It has, however, been hampered by lack of a suitable method for localizing the atoms. Only with localized atoms can the probe laser be focused tightly as required to generate sufficient intensity. The dipole trap proposed here can solve this problem and enable direct laser spectroscopy of the transition. This can lead to higher precision clocks (as the nucleus is less sensitive to the environment), as well as tests of the time variability of fundamental "constants" with unprecedented accuracy.

Providing a dielectric coating technology capable of fabricating uniformly controllable dielectric layers mirrors on high NA-cavity interior surfaces enables higher resonance enhancement, and thus allows use of lower cost lower power lasers, or longer laser wavelengths (which would enable use of a lower NA cavity).

Compared to the conventional microstructured phase plates mentioned above, it may be appreciated that the resonant optical cavity phase plate has several advantages: It does not use any mechanical electrodes inside the electron beam; the optical elements required to bring in the laser beam can be sufficiently far away (1 mm or more) so that problems with blurring and distorting the images are avoided; it overcomes the problems of short device life time, which currently limits the performance of the thin-film type of phase plate; it overcomes the problem of partial loss of scattered electrons, which occurs for both thin-film phase plates and electrostatic or magnetic phase plates; and it will make electron microscopy more productive and more efficient because it does not generate a partial loss of signal and because there are no interruptions caused by the need to replace a microstructure or thin-film phase plate that had aged or that had become contaminated when hit by the electron beam.

By converting phase into amplitude contrast, resonant optical cavity phase TEM may capture meaningful signals from very small amounts of unstained, and therefore unaltered, material. This method is thus useful to all research programs that use the electron microscope to determine the structure of unstained biological materials, or low atomic-number materials in general, including organic polymers and other soft materials. These programs include biology and materials science research, medical schools, private research institutes, or chemical companies developing new polymer materials. Usage is likely to also grow to include research laboratories in the biotech and pharmaceutical sector.

Figure 13:
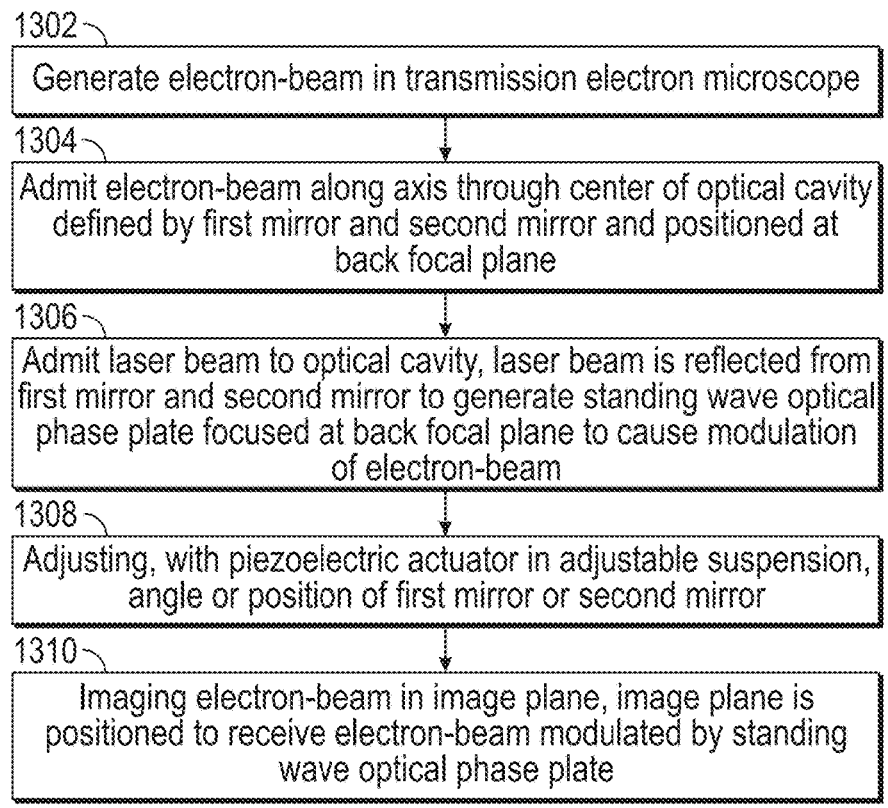
FIG. 13 is a flow diagram of a method of enhancing phase contrast in an electron beam image.

FIG. 13 is a flow diagram of a method of enhancing phase contrast in an electron beam image. The method can be practiced using a transmission electron microscope, an optical cavity and a laser.

In an action 1302, and electron-beam is generated in a transmission electron microscope. In an action 1304, the electron-beam is admitted along an axis through the center of the optical cavity defined by the first mirror and the second mirror and positioned at the back focal plane of the transmission electron microscope.

In an action 1306, the laser beam is admitted to the optical cavity. The laser beam is reflected from the first mirror and the second mirror to generate a standing wave optical phase plate. The standing wave optical phase plate is focused at the back focal plane, to cause modulation of the electron-beam.

In an action 1308, an angle or position of the first mirror or the second mirror is adjusted, with a piezoelectric actuator in an adjustable suspension. In an action 1310, the electron-beam is imaged in the image plane of the transmission electron microscope. The image plane is positioned to receive the electron beam modulated by the standing wave optical phase plate.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the embodiments of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A system for electron beam imaging or electron beam spectroscopy comprising:
a transmission electron microscope (TEM) having a back focal plane;
a plurality of mirrors forming an optical cavity, a focal spot of the optical cavity positioned at the back focal plane of the TEM, the optical cavity positioned to allow an electron beam provided by the TEM to pass through the focal spot of the optical cavity, and the optical cavity being operable to admit a laser beam;
a laser coupled to the optical cavity and operable to provide a laser beam of a specified wavelength to enter the optical cavity, the laser beam being reflected from the plurality of mirrors to provide a standing wave optical phase plate focused at the back focal plane of the TEM to cause a modulation of the electron beam; and
an image plane of the TEM positioned to receive the electron beam modulated by the standing wave optical phase plate.

2. The system of claim 1, wherein the plurality of mirrors comprises a first mirror and a second mirror.

3. The system of claim 1, wherein a reflective surface of each of the plurality of mirrors is coated with a reflective dielectric coating.

4. The system of claim 1, wherein a reflectivity of each of the plurality of mirrors is about 0.9 or greater.

5. The system of claim 1, wherein at least one of the plurality of mirrors has a radius of curvature of 5 cm or less.

6. The system of claim 1, further comprising:
a cavity housing, having the optical cavity therein and having an adjustable suspension operable for adjustment of angle and position of at least one of the plurality of mirrors.

7. The system of claim 1, further comprising:
an adjustable suspension including piezoelectric actuators to adjust angle or position of at least one of the plurality of mirrors.

8. A method of enhancing phase contrast in an electron beam image comprising:
generating an electron beam in a transmission electron microscope (TEM) having a back focal plane;
admitting the electron beam along an axis through a center of an optical cavity, the optical cavity being positioned at the back focal plane, and the optical cavity being defined by a first mirror and a second mirror;
admitting a laser beam to the optical cavity, the laser beam being reflected from the first mirror and the second mirror to generate a standing wave optical phase plate focused at the back focal plane of the TEM to cause a modulation of the electron beam; and
imaging the electron beam in an image plane of the TEM positioned to receive the electron beam modulated by the standing wave optical phase plate.

9. The method of claim 8, wherein the laser beam being reflected from the first mirror and the second mirror comprises the laser beam being reflected by the first mirror with the first mirror having a reflective dielectric coating and the laser beam being reflected by the second mirror with the second mirror having a further reflective dielectric coating.

10. The method of claim 8, wherein the laser beam being reflected from the first mirror and the second mirror comprises the laser beam being reflected by the first mirror with the first mirror having about 0.9 or greater reflectivity and the laser beam being reflected by the second mirror with the second mirror having about 0.9 or greater reflectivity.

11. The method of claim 8, wherein the laser beam being reflected comprises the laser beam being reflected by at least one of the first mirror and the second mirror having a radius of curvature of 5 cm or less.

12. The method of claim 8, further comprising:
adjusting angle or position of the first mirror or the second mirror, in an adjustable suspension.

13. The method of claim 8, further comprising:
adjusting, with a piezoelectric actuator, angle or position of the first mirror or the second mirror.

14. A device comprising:
a first mirror having a first front surface comprising a first concave mirror;
a second mirror having a second front surface comprising a second concave mirror;
the first mirror or the second mirror having a curvature radius of about 5 cm or less; and
the first mirror and the second mirror defining an optical cavity having a resonant optical mode with focal spot size of about 30 μm or less.

15. The device of claim 14, wherein the device is operable to: be positioned at a back focal plane of a transmission electron microscope (TEM); admit an electron beam of the TEM; admit a laser beam to the optical cavity, an interaction of the laser beam and the electron beam generating a phase-shift in the electron beam; and allow the electron beam to exit the optical cavity.

16. The device of claim 14, wherein a reflectivity of each of the first front surface and the second front surface is about 0.9 or greater.

17. The device of claim 14, wherein a reflectivity of each of the first front surface and the second front surface is about 0.99 or greater.

18. The device of claim 14, wherein power of a laser beam is amplified by the optical cavity by a factor of about 10 or more.

19. The device of claim 14, further comprising:
a piezoelectric actuator to adjust position or angle of the first mirror or the second mirror.

20. The device of claim 14, further comprising:
an adjustable suspension for adjustment and active damping of vibration of the first mirror or the second mirror.

* * * * *